(12) United States Patent  (10) Patent No.: US 7,977,580 B2
Ueno et al.  (45) Date of Patent: Jul. 12, 2011

(54) INTERMEDIATE MULTILAYER WIRING BOARD PRODUCT, AND METHOD FOR MANUFACTURING MULTILAYER WIRING BOARD

(75) Inventors: Seigo Ueno, Ichinomiya (JP); Toshiya Asano, Ichinomiya (JP)

(73) Assignee: NGK Spark Plug Co., Ltd., Nagoya, Aichi (JP)

( * ) Notice: Subject to any disclaimer, the term of this patent is extended or adjusted under 35 U.S.C. 154(b) by 0 days.

(21) Appl. No.: 12/473,609

(22) Filed: May 28, 2009

(65) Prior Publication Data

US 2009/0294156 A1   Dec. 3, 2009

(30) Foreign Application Priority Data

May 28, 2008  (JP) ................ P2008-138885
May 30, 2008  (JP) ................ P2008-142667

(51) Int. Cl.
  *H05K 1/16*  (2006.01)
(52) U.S. Cl. .......... 174/260; 174/255; 174/257
(58) Field of Classification Search .......... 438/460, 438/107, 108, 612; 174/260; 428/112
  See application file for complete search history.

(56) References Cited

U.S. PATENT DOCUMENTS

| 6,107,179 | A  | * | 8/2000 | Zomorrodi et al. | ............ | 438/612 |
| 6,255,697 | B1 | * | 7/2001 | Yoo et al. | ............ | 257/365 |
| 6,489,218 | B1 | * | 12/2002 | Kim et al. | ............ | 438/460 |
| 6,988,312 | B2 |  | 1/2006 | Nakamura et al. | | |
| 7,015,069 | B2 | * | 3/2006 | Takahashi et al. | ............ | 438/114 |
| 7,153,724 | B1 | * | 12/2006 | Sirinorakul et al. | ............ | 438/112 |
| 2002/0096789 | A1 | * | 7/2002 | Bolken | ............ | 257/787 |
| 2003/0168249 | A1 | * | 9/2003 | Ito et al. | ............ | 174/255 |
| 2005/0126818 | A1 | * | 6/2005 | Kojima et al. | ............ | 174/255 |
| 2007/0064375 | A1 | * | 3/2007 | Urashima et al. | ............ | 361/311 |

FOREIGN PATENT DOCUMENTS

JP   2007-180212   7/2007

* cited by examiner

*Primary Examiner* — Tuan T Dinh
*Assistant Examiner* — Steven Sawyer
(74) *Attorney, Agent, or Firm* — Stites & Harbison PLLC; Jeffrey A. Haeberlin

(57) ABSTRACT

An intermediate multilayer wiring board product includes: a stack of a plurality of resin insulating layers, a first conductor layer, and a second conductor layer. The stack includes: a product forming region comprising a plurality of product portions arranged along a major surface of the stack, each of the plurality of product portions to become a product of the multilayer wiring board; and a frame portion surrounding the product forming region. The first conductor layer is formed on at least one of the plurality of resin insulating layers within each of the plurality of product portions. The second conductor layer is formed on at least one of the plurality of resin insulating layers within the frame portion. The frame portion has a plurality of cuts penetrating the frame portion in a thickness direction thereof, the plurality of cuts being arranged at substantially equal intervals.

10 Claims, 16 Drawing Sheets

INTERMEDIATE MULTILAYER WIRING BOARD PRODUCT, AND METHOD FOR MANUFACTURING MULTILAYER WIRING BOARD

CROSS-REFERENCE TO RELATED APPLICATIONS

This application is based on and claims priority to Japanese patent Application No. 2008-138885 filed May 28, 2008 and Japanese patent Application No. 2008-142667 filed May 30, 2008, the above applications incorporated herein by reference in their entirety.

BACKGROUND OF THE INVENTION

1. Field of the Invention

The present invention relates to an intermediate multilayer wiring board product (i.e., an intermediate product of a multilayer wiring board manufacturing method, or an intermediate product of a multilayer wiring board) including a product forming region in which a plurality of product portions to become products are arranged along a planar direction and a frame portion surrounding the product forming region, as well as to a method for manufacturing a multilayer wiring board obtained from an intermediate product of a multilayer wiring board.

2. Description of Related Art

As one technique for efficiently manufacturing a wiring board, a plurality of wiring board products are obtained from one intermediate wiring board product. Such intermediate product usually includes: a product forming region in which a plurality of product portions that are to become products are arranged along a direction of a plane; and a frame portion surrounding the product forming region. A product-side conductor layer is formed on surfaces of product portions that are to become products, whereas no conductor layer is formed on the surface of the frame portion that is not to become a product. In recent years, a dummy conductor layer (a frame-side conductor layer) made by plating is provided in a solid pattern on the surface of the frame portion for the purpose of suppressing warping (also referred to as "warpage"). Moreover, another wiring board includes a frame-side conductor layer having a meshed pattern rather than in a solid pattern (see, for example, JP-A-2007-180212).

As an intermediate product of the wiring board, an intermediate multilayer wiring board product of a has been put into practical use. The intermediate multilayer wiring board product includes a core board and a build-up layer formed on each of front and back surfaces of the core board. In the intermediate multilayer wiring board product, for example, a resin board (such as a glass epoxy board, and the like) made by impregnating reinforced fiber with resin is used for the core board. The build-up layer is made by alternately stacking a resin insulating layer and a conductor layer on each of the front and back surfaces of the core board, thereby utilizing the rigidity of the core board. In short, the core board reinforces the intermediate multilayer wiring board product and has a thickness largely thicker than the build-up layer. The intermediate product includes an interconnection (specifically a through hole conductor and the like) penetrating the core board for establishing electrical connection between build-up layers formed on the front surface and the back surface of the core board. The intermediate product allows a semiconductor integrated circuit element (an IC chip), such as a microprocessor of a computer and the like, to be mounted thereon.

Recently, as semiconductor integrated circuit elements become faster, signal frequencies used in the elements increase (i.e., become higher). Under these circumstances, the interconnection penetrating through the core board acts as a large inductance, which in turn leads to the occurrence of transmission losses in the high-frequency signals and faulty circuit operations. Thus, a increasing the speed of the semiconductor integrated circuit elements may be hindered. In view of this disadvantage, a coreless multilayer wiring board (i.e., a wiring board not having any core board) is proposed (see, for example, JP-B-3664720). Since a relatively thick core board is omitted from the coreless wiring board, the entire length of the interconnection is shortened. Consequently, transmission losses in high frequency signals are reduced, and the semiconductor integrated circuit elements can be operated at high speed.

BRIEF SUMMARY OF THE INVENTION

However, since the coreless wiring board is manufactured without a core board, the strength of the coreless wiring board may be insufficient. When a multilayer wiring board is manufactured as a coreless wiring board, even if the dummy conductor layer is formed on the surface of a frame portion, the strength of an intermediate multilayer wiring board product is insufficient. Consequently, when a component such as a semiconductor integrated circuit element and a capacitor is bonded to an intermediate product, and when solder used for the bonding is cooled, the intermediate product may warp under the influence of thermal stress caused by a difference in a coefficient of thermal expansion between a product forming region and the frame portion, thereby deteriorating the yield of the multilayer wiring board.

The present invention was made in consideration of the above circumstances. An object of the invention is to provide an intermediate multilayer wiring board product which improves product yields by preventing the occurrence of warpage. Another object thereof is to provide a method for manufacturing a multilayer wiring board having improved yields.

According to one aspect of the invention, an intermediate multilayer wiring board product comprises: a stack of a plurality of resin insulating layers, a first conductor layer and a second conductor layer. The stack comprises: a product forming region comprising a plurality of product portions arranged along a major surface of the stack, each of the plurality of product portions to become a product of the multilayer wiring board; and a frame portion surrounding the product forming region. The first conductor layer is formed on at least one of the plurality of resin insulating layers within each of the plurality of product portions. The second conductor layer is formed on at least one of the plurality of resin insulating layers within the frame portion. The frame portion has a plurality of cuts penetrating the frame portion in a thickness direction thereof, the plurality of cuts being arranged at substantially equal intervals.

Therefore, according to this aspect of the intermediate product of the multilayer wiring board, even if thermal stress caused by a difference in a thermal expansion coefficient between the product forming region and the frame portion is applied the intermediate multilayer wiring board product when a component is connected to the first conductor layer, the plurality of cuts deform, which suppresses the influence of thermal stress. The cuts are arranged at substantially equal intervals in the frame portion, which can equalize amounts of deformation among the cuts when thermal stress is applied to the intermediate product. Consequently, the influence of thermal stress is uniformly suppressed. Therefore, occurrence of warpage in the intermediate multilayer wiring board product can be prevented, and yields of products produced from intermediate products can be improved.

When the multilayer wiring board does not include a core board and includes alternately-stacked resin insulating layers and first conductor layers in which the resin insulating layers are of a same type and the first conductor layers are connected through via holes diametrically enlarged in one direction, the multilayer wiring board can not have a sufficient strength, and warpage of the intermediate multilayer wiring board product becomes more noticeable. However, when the cuts are provided in the multilayer wiring board not having a core board, occurrence of warpage in an intermediate product can be prevented more effectively.

In this and following aspects, the "intermediate wiring board product" indicates a concept relative to a finished multilayer wiring board product. Specifically, the "intermediate product" designates a multilayer wiring board to which a separation process has not been completed. The separation process is for separating products from one another by removing the frame portion from the product forming regions and cutting the product forming regions along the cutting lines set along the contour lines of the product portions. In general, an intermediate multilayer wiring board product, product forming regions, and product portions have a substantially-rectangular shape as viewed from above (in plan view). An area of the product portion is considerably smaller than the area of the product forming region. Accordingly, for example, tens to hundreds of product portions are arranged within the product forming region.

The "frame portion" indicates a region that does not become a product and is separated and removed from the product forming region during manufacturing processes and that surrounds the periphery of the product forming region. A second conductor layer is formed in the frame portion as a so-called a dummy conductor layer.

The intermediate multilayer wiring board product has a structure including a plurality of stacked resin insulating layers. The resin insulating layer may be selected in light of, for example, an insulating property, heat resistance, and humidity resistance. The resin insulating layer may be formed of any of the following materials: thermosetting resins, such as an epoxy resin, a phenol resin, an urethane resin, a silicone resin, and a polyimide resin; and thermoplastic resins, such as a polycarbonate resin, an acrylic resin, a polyacetal resin, and a polypropylene resin. In addition, there may also be used a composite material including any of these resins and inorganic fiber such as glass fiber (glass woven fabric or glass nonwoven fabric), or a composite material of the resin and organic fiber such as polyamide fiber, or a resin-resin composite material obtained by impregnating a three-dimensional meshed fluorine-based resin material, such as expanded PTFE, with thermosetting resin, such as epoxy resin. In order to form via conductors for interlayer connection purpose, via holes may also be previously formed in the resin insulating layer.

The first conductor layer and the second conductor layer may be patterned on the resin insulating layer, for example, by a subtractive method, a semi-additive method, a full-additive method, and the like. The first conductor layer and the second conductor layer are formed, for example, of a metal material such as copper, a copper alloy, nickel, a nickel alloy, tin, a tin alloy, and the like.

A solder bump used for connecting a component may be provided on the first conductor layer formed on an outermost resin insulating layer of the stack. The solder bump can electrically connect between the first conductor layer and the component.

A metal material forming the solder bump may be selected in accordance with a material forming a connection terminal of a component to be mounted, and the like. For example, any of the following materials may be used as the metal material forming the solder balls: Pb—Sn-based solder, such as 90Pb-10Sn, 95Pb-5Sn, or 40Pb-60Sn; Sn—Sb-based solder; Sn—Ag-based solder; Sn—Ag—Cu-based solder; Au—Ge-based solder; and Au—Sn-based solder.

An example of the component may be a capacitor, a semiconductor integrated circuit element (an IC chip), a MEMS (Micro-Electro-Mechanical System) element manufactured in a semiconductor manufacturing process, and the like. Further, the IC chip may be DRAM (Dynamic Random Access Memory), SRAM (Static Random Access Memory), and the like. The "semiconductor integrated circuit element" may refer to an element used as a microprocessor of a computer, and the like.

The plurality of cuts penetrate through the frame portion in its thickness direction and become open in an outer edge of the frame portion. The cut viewed from the thickness direction may have a substantially V-shape, a substantially U-shape, or the like. At least one of the plurality of cuts may also be a slit that is arranged along an extension of the cutting line set along the contour lines of the product portions and having substantially the same width as an interval between the contour lines of adjacent product portions. In such a case, a plurality of cuts are arranged in accordance with the product portions generally arranged at equal intervals, and hence it becomes easy to arrange the plurality of cuts at equal intervals. Although the depth of the cut is not particularly limited, the depth may be set substantially equal to the width of the frame portion (a distance from a border between the frame portion and the product forming region to an outer edge of the frame portion). Specifically, the frame portion may also be separated by a plurality of cuts. In other words, as the cuts become deeper, the influence of thermal stress applied to the intermediate multilayer wiring board product can be eased more effectively. Hence, occurrence of warpage of the intermediate product can be prevented more reliably.

The frame portion may have a plurality of edge portions surrounding the product forming region and a plurality of corner portions each connecting the adjacent edge portions. The cuts located at the corner portions, among the plurality of cuts, may be arranged so as to eliminate the corner portions. According to the cuts arranged in this way, cuts larger than the cuts located at the edge portions can be made in the corner portions. Consequently, the influence of thermal stress applied to an intermediate multilayer wiring board product can be suppressed more reliably. As mentioned above, occurrence of warpage of the intermediate product can be prevented more reliably, and product yields are enhanced further.

The plurality of cuts may be formed after formation of the first conductor layer and the second conductor layer. When the plurality of cuts are formed prior to formation of the first conductor layer and the second conductor layer, it will become difficult to attach a mask used for etching when the first conductor layer and the second conductor layer are formed by patterning of metal foil through etching.

According to another aspect of the invention, an intermediate multilayer wiring board product comprises: a stack of a plurality of resin insulating layers, a first conductor layer, and a second conductor layer. The stack comprises: a product forming region comprising a plurality of product portions arranged along a major surface of the stack, each of the plurality of product portions to become a product of the multilayer wiring board; and a frame portion surrounding the product forming region. The first conductor layer is formed on at least one of the plurality of resin insulating layers within each of the plurality of product portions. The second conductor layer is formed on at least one of the plurality of resin insulating layers within the frame portion, except for a plurality of non-formation regions arranged in the frame portion such that a first area ratio of the first conductor layer to the product forming region is substantially equal to a second area ratio of the second conductor layer to the frame portion.

According to this aspect of the intermediate multilayer wiring board product, a plurality of non-formation regions are arranged to thus make a first area ratio of the first conductor layer to the product forming region is substantially equal to a second area ratio of the second conductor layer to the frame portion. Consequently, it is possible to reduce a difference in a coefficient of thermal expansion between the product forming region and a coefficient of thermal expansion of the frame portion. Even if thermal stress caused by the difference in coefficient of thermal expansion is applied to the intermediate multilayer wiring board product when a component is connected to the first conductor layer, warpage hardly occurs in the intermediate product. Therefore, yields of products produced from the intermediate products can be enhanced.

For the purpose of description, the "first area ratio of a first conductor layer to a product forming region" refers to a ratio of a first conductor layer occupying a given area when the given area is set on the surface of the product forming region (an exposure ratio). Likewise, the "area ratio of a second conductor layer to a frame portion" refers to a ratio of the second conductor layer occupying a given area when the given area is set on the surface of the frame portion (an exposure ratio). Further, the expression "a first area ratio of the first conductor layer to the product forming region equals to a second area ratio of the second conductor layer to the frame portion" is assumed to include a case where the first and second area ratios are made substantially equal to each other, as well as including a case where the area ratios are made completely identical with each other.

The first area ratio of the first conductor layer to the product forming region may be equal to the second area ratio of the frame-side conductor layer to the frame portion at each layer of the stack by arranging the plurality of non-formation regions on all of the resin insulating layers within the frame portion. As a result, it is possible to reduce a difference in a coefficient of thermal expansion between the product forming region and the frame portion. Consequently, even if thermal stress caused by the difference in coefficient of thermal expansion is applied to the intermediate product of a multilayer wiring board, warpage hardly occurs in the intermediate product.

When the multilayer wiring board is a wiring board that does not include a core board and includes alternately-stacked resin insulating layers and first conductor layers in which the resin insulating layer are of a same type and the first conductor layers are connected only through via holes diametrically enlarged in one direction, the strength of the multilayer wiring board is insufficient, and warpage of the intermediate multilayer wiring board product increases or becomes more noticeable. However, when the non-formation regions are provided in the multilayer wiring board not having a core board, occurrence of warpage in an intermediate product can be prevented more effectively.

The plurality of non-formation regions are arranged on at least one of the resin insulating layers within the frame portion. The non-formation region may have a substantially V-shape, a substantially U-shape, and the like. At least one of the plurality of non-formation regions may also be a slit-shaped area that is arranged along an extension of a cutting line set along the contour line of the product portion. In such a case, a plurality of non-formation regions are arranged in accordance with the product portions generally arranged at equal intervals, and hence it becomes easy to arrange the plurality of non-formation regions at equal intervals. Consequently, it becomes easy to make uniform the second area ratio of the second conductor layer to the frame portion at any area in the frame portion. Therefore, it is possible to reduce a difference in a coefficient of thermal expansion between the product forming region and the frame portion. Accordingly, even if thermal stress caused by the difference in coefficient of thermal expansion is applied to an intermediate product of a multilayer wiring board, warpage of the intermediate product hardly occurs. When the non-formation region is a slit-shaped region, although not particularly limited, the depth of the non-formation region may be set so as to become equal, for example, to the width of the frame portion (a distance from a boundary between the frame portion and the product forming region to an outer edge of the frame portion). Specifically, the second conductor layer may be separated by a plurality of non-formation regions.

The frame portion may have a plurality of edge portions surrounding the product forming region and a plurality of corner portions each connecting the adjacent edge portions. The non-formation regions located at the corner portions, among the plurality of non-formation regions, may occupy the entire corner portions such that the first area ratio of the first conductor layer to the product forming region is equal to the second area ratio of the second conductor layer to the frame portion. The second conductor layer may have a meshed pattern to have the second area ratio of the second conductor layer to the frame portion equal to the first area ratio of the first conductor layer to the product forming region. A method for arranging non-formation regions may be selected in accordance with the first area ratio of the first conductor layer to the product forming region.

When the second conductor layer is made in a meshed pattern, the burden of pattern design can be alleviated. Therefore, prevention of an increase in cost becomes easy to attain. The meshed second conductor layer may be any layer, so long as an area including a conductor layer and an area not including a conductor layer are continuously present in a regular pattern. However, from the viewpoint of alleviation of the burden of pattern design, a plurality of line patterns are preferably arranged so as to cross each other. More specifically, the meshed second conductor layer is preferably made by causing a plurality of first line patterns arranged at equal intervals and a plurality of second line patterns arranged at equal intervals to cross each other at a right angle. In this case, although the width of the line pattern is not particularly limited, it is preferable to set the width of the line pattern, for example, to a range from 0.1 mm to 1.5 mm; further a range from 0.2 mm to 1.3 mm, and more particularly to a range from 0.3 mm to 1.0 mm.

According to yet another aspect of the invention, a method for manufacturing a multilayer wiring board comprises: a preparation process comprising preparing an intermediate product of a multilayer wiring board, and a cut formation process. The intermediate product comprises: a stack of a plurality of resin insulating layers, a first conductor layer and a second conductor layer. The stack comprises: a product forming region comprising a plurality of product portions arranged along a major surface of the stack, each of the plurality of product portions to become a product of the multilayer wiring board; and a frame portion surrounding the product forming region. The first conductor layer is formed on at least one of the plurality of resin insulating layers within each of the plurality of product portions. The second conductor layer is formed on at least one of the plurality of resin insulating layers within the frame portion. The cut formation process comprises forming a plurality of cuts in the frame portion of the intermediate product so as to penetrate the frame portion in a thickness direction thereof.

According to this aspect of the method for manufacturing a multilayer wiring board, if thermal stress caused by a difference in a coefficient of thermal expansion between the product forming region and the frame portion is applied to the plurality of resin insulating layers when a component is connected to the first conductor layer after the cut formation process, the influence of thermal stress is suppressed by the deformation of the plurality of cuts. Consequently, it is possible to suppress occurrence of warpage in the intermediate multilayer wiring board product, and therefore enhance yields of multilayer wiring boards produced from intermediate products.

The method for manufacturing a multilayer wiring board of this aspect will be described hereunder.

In the preparation process, there is prepared an intermediate multilayer wiring board product including a plurality of resin insulating layers that are stacked, a product forming region in which a plurality of product portions that are to become products are longitudinally and laterally arranged, a frame portion surrounding the product forming region, a first conductor layer that is formed on the resin insulating layer within the product portion, and a second conductor layer that is formed on the resin insulating layer within the frame portion.

The preparation process includes: a stacking process comprising staking the plurality of resin insulating layers on a base member whose one surface has metal foil; a base member removal process comprising removing the base member after the stacking process, to thus expose the metal foil; a first conductor layer formation process comprising patterning the metal foil after the base member removal process, to thus make the first conductor layer within the plurality of product portions on an outermost resin insulating layer; and a solder bump formation process comprising making, on the first conductor layer formed on the outermost resin insulating layer, a solder bump used for connecting a component after the first conductor layer formation process. By simultaneously performing the second conductor layer formation process for forming the second conductor layer within the frame portion on the outermost resin insulating layer and the first conductor layer formation process, processes for manufacturing a multilayer wiring board can be shortened.

For example, any one of silver, gold, platinum, copper, titanium, aluminum, palladium, nickel, and tungsten may be used as the metal foil. In particular, metal foil is preferably made of copper. If the metal foil is made of copper, as compared with the metal foil made of another material, the resistance of the metal foil can be reduced, and conductivity of the metal foil is enhanced.

In a subsequent cut formation process, a plurality of cuts penetrating through the frame portion in its thickness direction are formed in the frame portion. The cuts may be formed by drilling the frame portion, by subjecting the frame portion to laser machining, by punching the frame portion through use of a punch die, and the like.

The cut formation process may be performed after the first conductor layer formation process. When the cut formation process is performed before first conductor layer formation process, it will become difficult to attach a mask used for etching when pattern is performed through the etching in the first conductor layer formation process. Further, the cut formation process may be performed prior to the solder bump formation process. When the cut formation process is performed after the solder bump formation process, the solder bump, which is important for component connection purpose, may be damaged during the formation of cuts.

Subsequently, a separation process is performed for separating products from each other by removing the frame portions from the product formation areas and cutting the product forming region along the cutting lines set along the contour lines of the product portions, whereby a plurality of pieces of products (multilayer wiring boards) can be obtained.

According to a still another aspect of the invention, a method for manufacturing a multilayer wiring board comprises: a preparation process comprising preparing an intermediate multilayer wiring board product; and a separation process. The intermediate product comprises: a stack of a plurality of resin insulating layers; a first conductor layer; and a second conductor layer. The stack comprises: a product forming region comprising a plurality of product portions arranged along a major surface of the stack, each of the plurality of product portions to become a product of the multilayer wiring board; and a frame portion surrounding the product forming region. The first conductor layer is formed on at least one of the plurality of resin insulating layers within the product portion. The second conductor layer is formed on at least one of the plurality of resin insulating layers within the frame portion, except for a plurality of non-formation regions arranged in the frame portion such that a first area ratio of the first conductor layer to the product forming region is substantially equal to a second area ratio of the second conductor layer to the frame portion. The separation process comprises removing the frame portion from the product forming region and cutting the product forming region along cutting lines, thereby separating the plurality of product portions (i.e., the products) from each other.

Therefore, according to this aspect of the method for manufacturing a multilayer wiring board, a plurality of non-formation regions are arranged in the preparation process such that a first area ratio of the first conductor layer to the product forming region is equal to a second area ratio of the second conductor layer to the frame portion. As a consequence, it is possible to reduce a difference in a coefficient of thermal expansion between the product forming region and the frame portion. Consequently, even if thermal stress caused by the difference in coefficient of thermal expansion is applied to the intermediate multilayer wiring board product when a component is connected to the first conductor layer after the preparation process, warpage in the intermediate product hardly occurs. Therefore, yields of multilayer wiring boards produced from the intermediate products can be enhanced.

The method for manufacturing a multilayer wiring board of this aspect will be described hereunder.

In the preparation process, there is prepared an intermediate multilayer wiring board product including a plurality of resin insulating layers that are stacked, a product forming region in which a plurality of product portions that are to become products are arranged, for example, in longitudinal and lateral directions, a frame portion surrounding the product forming region, a first conductor layer that is formed on the resin insulating layer within the product portion, a second conductor layer that is formed on the resin insulating layer within the frame portion, and a plurality of non-formation regions which are arranged on at least one of the resin insulating layers within the frame portion and in which the second conductor layer is not formed, such that a first area ratio of the first conductor layer to the product forming region is equal to a second area ratio of the second conductor layer to the frame portion.

Other features and advantages of the invention will be set forth in, or apparent from, the detailed description of the exemplary embodiments of the invention found below.

DETAILED DESCRIPTION OF EXEMPLARY EMBODIMENTS OF THE INVENTION

Exemplary embodiments of the invention will be described in detail with reference to the drawings.

First Exemplary Embodiment

Figure 1:
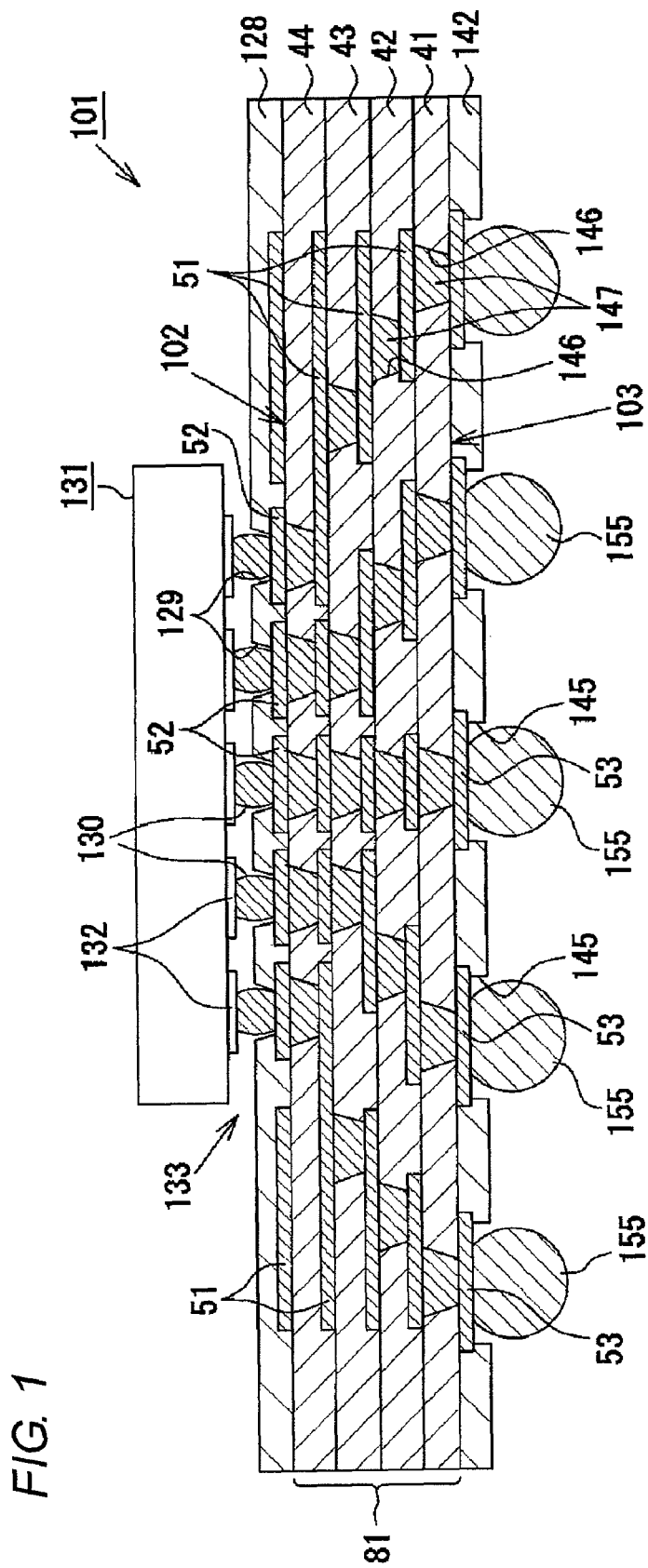
FIG. 1 is a schematic cross-sectional view showing a coreless wiring board of a first and second exemplary embodiment of the invention.

FIG. 1 is a cross-sectional view showing a coreless wiring board 101 (a multilayer wiring board) of one exemplary embodiment. The coreless wiring board 101 is a wiring board that does not have any core board and that has a structure made by alternately stacking a conductor layer 51 made of copper and four resin insulating layers 41, 42, 43, and 44 made of an epoxy resin. The resin insulating layers 41 to 44 are intermediate insulating layers that have the same thickness and that are made of the same material (i.e., the resin insulating layers 41 to 44 are of a same type a resin insulating layer).

Terminal pads 52 are arranged in an arrayed pattern on a front surface 102 (a surface of a resin insulating layer 44 on the fourth stratum counted from bottom layer 41 of the stack of the resin insulating layers 41-44) of the coreless wiring board 101. Further, the substantially entire surface of the resin insulating layer 44 is covered with a solder resist 128. Openings 129 for exposing the respective terminal pads 52 are formed in the solder resist 128. A plurality of solder bumps 130 are arranged on surfaces of the respective terminal pads 52. The solder bumps 130 are electrically connected to face respective connection terminals 132 of an IC chip 131 (a component) having a substantially rectangular, flat plate shape. A region where the terminal pads 52 and the solder bumps 130 are formed is an IC chip mount region 133 where the IC chip 131 can be mounted.

As shown in FIG. 1, BGA pads 53 are arranged in an arrayed pattern on a rear surface 103 of the coreless wiring board 101 (on a lower surface of the resin insulating layer 41 on the first stratum of the stack). Substantially the entire lower surface of the resin insulating layer 41 is covered with a solder resist 142. Openings 145 for exposing the respective BGA pads 53 are formed in the solder resist 142. A plurality of solder bumps 155 are placed on surfaces of the respective BGA pads 53, and the coreless wiring board 101 is mounted on an unillustrated mother board by means of the solder bumps 155.

Via holes 146 and via conductors 147 are provided in the resin insulating layers 41 to 44. Each of the via holes 146 has an inverse circular truncated cone shape and is made by boring the resin insulating layers 41 to 44 through use of YAG laser or carbon dioxide gas laser. The via conductors 147 are diametrically increased in one direction (an upward direction in FIG. 1) and that electrically interconnects the conductor layers 51, the terminal pads 52, and the BGA pads 53.

An intermediate product 11 of the coreless wiring board 101 will now be described.

Figure 2:
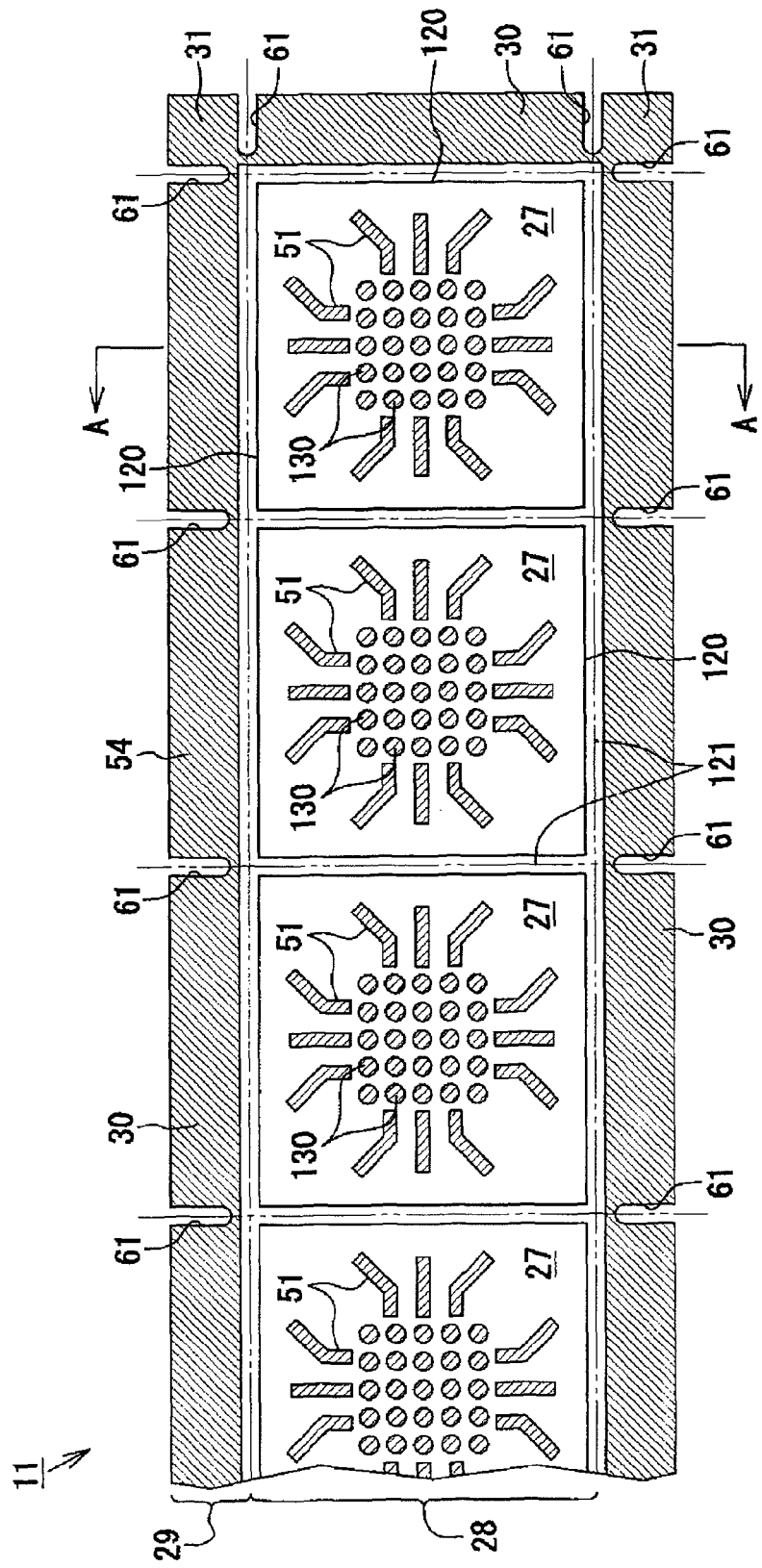
FIG. 2 is a schematic plan view showing an intermediate product of the coreless wiring board according to the first exemplary embodiment.
Figure 3:
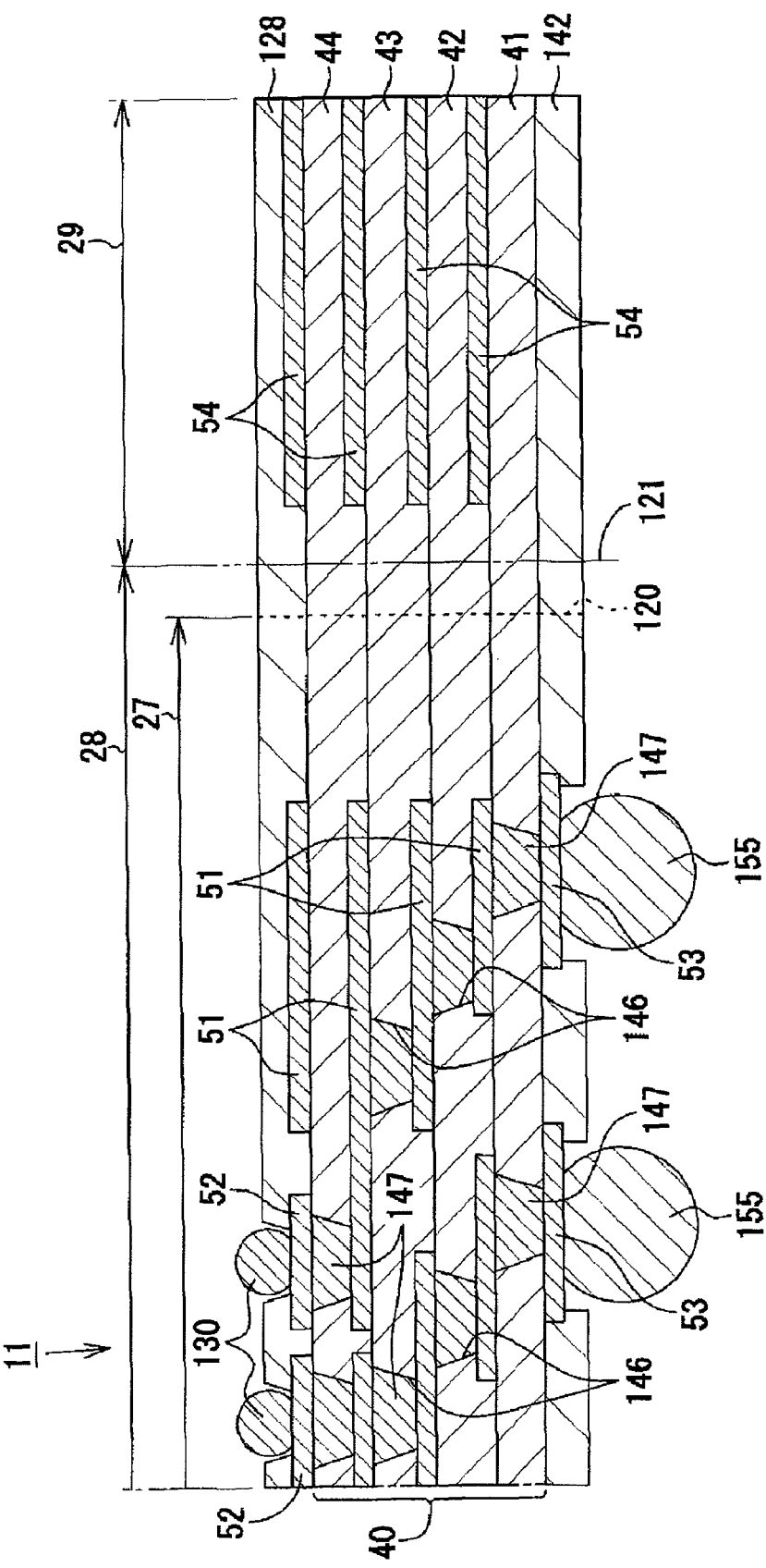
FIG. 3 is a cross-sectional view taken along a line A-A shown in FIG. 2.

The intermediate product 11 of the coreless wiring board 101 has a substantially rectangular shape when viewed from above, as shown in FIGS. 2 and 3. The intermediate product 11 includes a product forming region 28 and a frame portion 29 for surrounding the periphery of the product forming region 28. Five square product portions 27, which are to be products (the coreless wiring board 101), are arranged in the product forming region 28 along the direction of a major surface of the intermediate product 11. The frame portion 29 has four edge portions 30 arranged so as to surround the product forming regions 28 and four corner portions 31 which connects the adjacent edge portions 30.

As shown in FIG. 3, the conductor layers 51 as exemplary first conductor layers are formed on the surfaces of the resin insulating layers 41 to 44 within each of the product portions 27. The terminal pads 52 as exemplary first conductor layers are formed on a surface of the resin insulating layer 44 at the outermost stratum in the stack within each of the product portions 27. The BGA pads 53 as exemplary first conductor layers are formed on a lower surface of the resin insulating layer 41 at the outermost stratum within each of the product portions 27. Frame-side conductor layers 54 as exemplary second conductor layers are formed on the respective resin insulating layers 41 to 44 within each of the frame portions 29. The frame-side conductor layer 54 is a plane conductor formed to have a substantially rectangular shape over the substantially entire region in each of the frame portions 29. All of the frame-side conductor layers 54 are not left in final products and are to be called dummy conductor layers.

As shown in FIGS. 2 and 3, the intermediate product 11 of the coreless wiring board 101 is cut along contour lines 120 of respective product portions 27. Lines running along these contour lines 120 are defined as a cutting line 121. More specifically, cutting lines 121 for dividing the product portions 27 to be separated from one another are set between the contour lines 120 of the adjacent product portions 27. Further, other cutting lines 121 for use in separating the frame portion 29 from the product forming region 28 are set along a boundary between the product forming region 28 and the frame portion 29 in an area between the contour lines 120 of the product portions 27 and an inner edge of the frame-side conductor layer 54.

As shown in FIG. 2, the frame portion 29 has a plurality of slits 61 (cutout regions), each having a substantially U-shaped when viewed in a thickness direction (in plan view). The slits 61 are placed at equal intervals in the edge portions 30 and arranged along (or arranged on) an extension of the cutting line 121. Some of the slits 61 are arranged on boundaries between the edge portions 30 and the corner portions 31. The slits 61 are arranged such that each of areas defined between the adjacent slits 61 is smaller than a predetermined or given dimension. Each of the slits 61 is formed to penetrate the frame portion 29 in a thickness direction (specifically, the resin insulating layers 41 to 44, the frame-side conductor layer 54, and the solder resists 128 and 142) and become open in an outer edge of the frame portion 29. The width of each slit 61 is set substantially equal to an interval between the contour lines 120 of adjacent product portions 27 or an interval between the contour line 120 of the product portion 27 and the inner edge of the frame-side conductor layer 54. The depth of each of the slits 61 (i.e., the length of the slit 61 from its opening to its deep inside) is set slightly smaller than the width of the frame-side conductor layer 54 (a distance from the inner edge of the frame-side conductor layer 54 to an outer edge of the frame-side conductor layer 54).

A method for manufacturing the coreless wiring board 101 will now be described.

Figure 4:
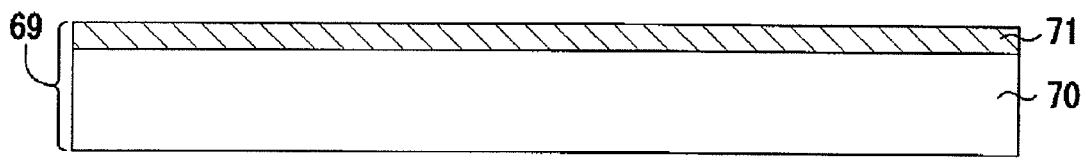
FIG. 4 is a diagram showing a configuration of components at one point in a method for manufacturing the coreless wiring board according to the first exemplary embodiment.
Figure 5:
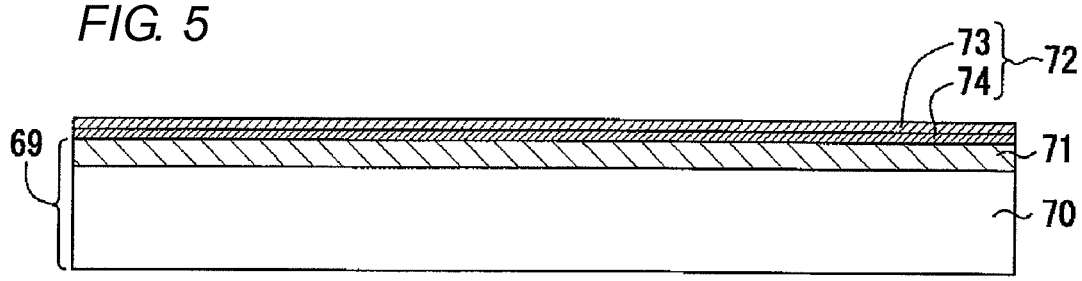
FIG. 5 is a diagram showing a configuration of components at another point in the method for manufacturing the coreless wiring board according to the first exemplary embodiment.

In a preparation process, the intermediate product 11 of the coreless wiring board 101 shown in FIGS. 2 and 3 is previously produced and prepared. The intermediate product 11 of the coreless wiring board 101 is prepared as follows. As shown in FIG. 4, a support board 70 exhibiting sufficient strength, such as a glass epoxy board, is first prepared. Next, a sheet-like insulating resin base member made of an epoxy resin is affixed on the support substrate 70 in a partially hardened state, so as to form a base resin insulating layer 71, whereby a base member 69 including a support board 70 and a substrate resin insulating layer 71 is obtained. As shown in FIG. 5, a multilayer metal sheet member 72 is placed on a one surface of the base member 69 (specifically, an upper surface of the base resin insulating layer 71). The multilayer metal sheet member 72 is placed on the base resin insulating layer 71 in a partially hardened state. Accordingly, it is possible to obtain a sufficient adhesion such that the multilayer metal sheet member 72 is not peeled out of the base resin insulating layer 71 during subsequent manufacturing processes. The multilayer metal sheet member 72 includes two sheets of copper foil 73, 74 (metal foil) adhered to each other in a peelable state. Specifically, the multilayer metal sheet member 72 is made by stacking the sheets of copper foil 73 and 74 by way of metal plating (e.g., chromium plating).

Figure 6:
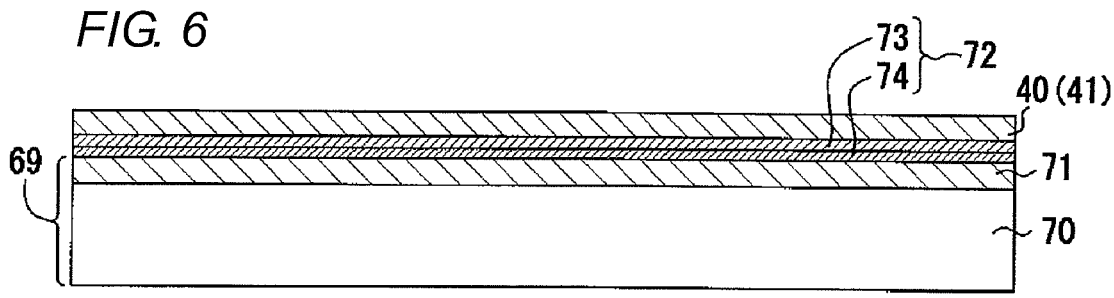
FIG. 6 is a diagram showing a configuration of components at another point in the method for manufacturing the coreless wiring board according to the first exemplary embodiment.
Figure 7:
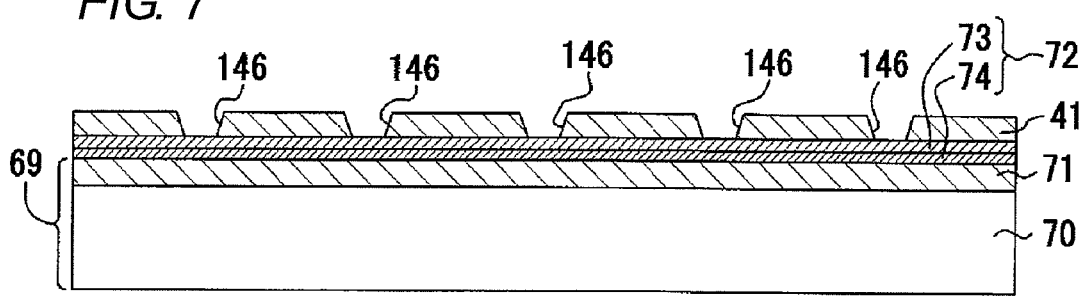
FIG. 7 is a diagram showing a configuration of components at another point in the method for manufacturing the coreless wiring board according to the first exemplary embodiment.

Subsequently, as shown in FIG. 6, the sheet-shaped insulating resin base member 40 is stacked on the multilayer metal sheet member 72, and the base member 40 is pressurized and heated in a vacuum by a vacuum pressure heat pressing machine (not shown) so as to cure the insulating resin base member 40, thereby forming the resin insulating layer 41 on the first stratum (a stacking process). As shown in FIG. 7, the via holes 146 are formed at given positions in the resin insulating layer 41 by laser machining, and desmear processing for eliminating smears in the respective via holes 146 is performed. Subsequently, electroless copper plating or electrolytic copper plating is performed, e.g., by a known technique, thereby forming the via conductors 147 in the respective via holes 146. Further, etching is performed, e.g., by a known technique (e.g., a semi-additive method), whereby a conductor layer 51 is patterned on the resin insulating layer 41 (see FIG. 8).

Figure 9:
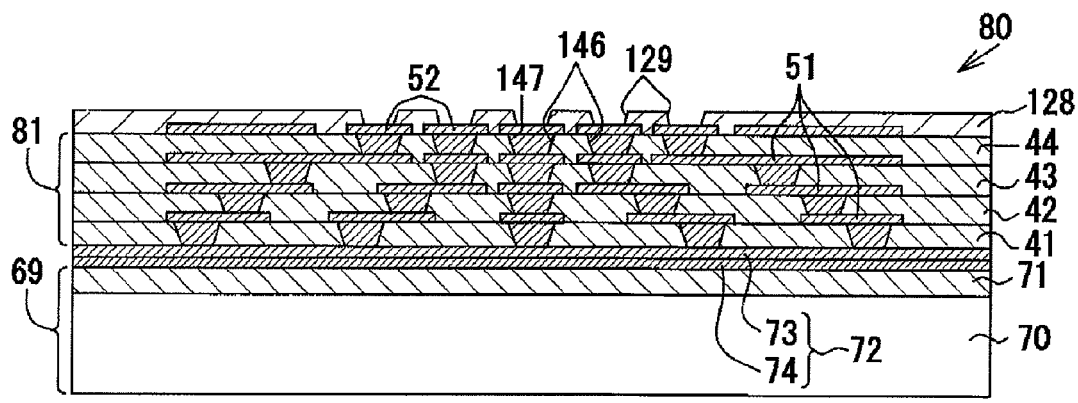
FIG. 9 is a diagram showing a configuration of components at another point in the method for manufacturing the coreless wiring board according to the first exemplary embodiment.
Figure 10:
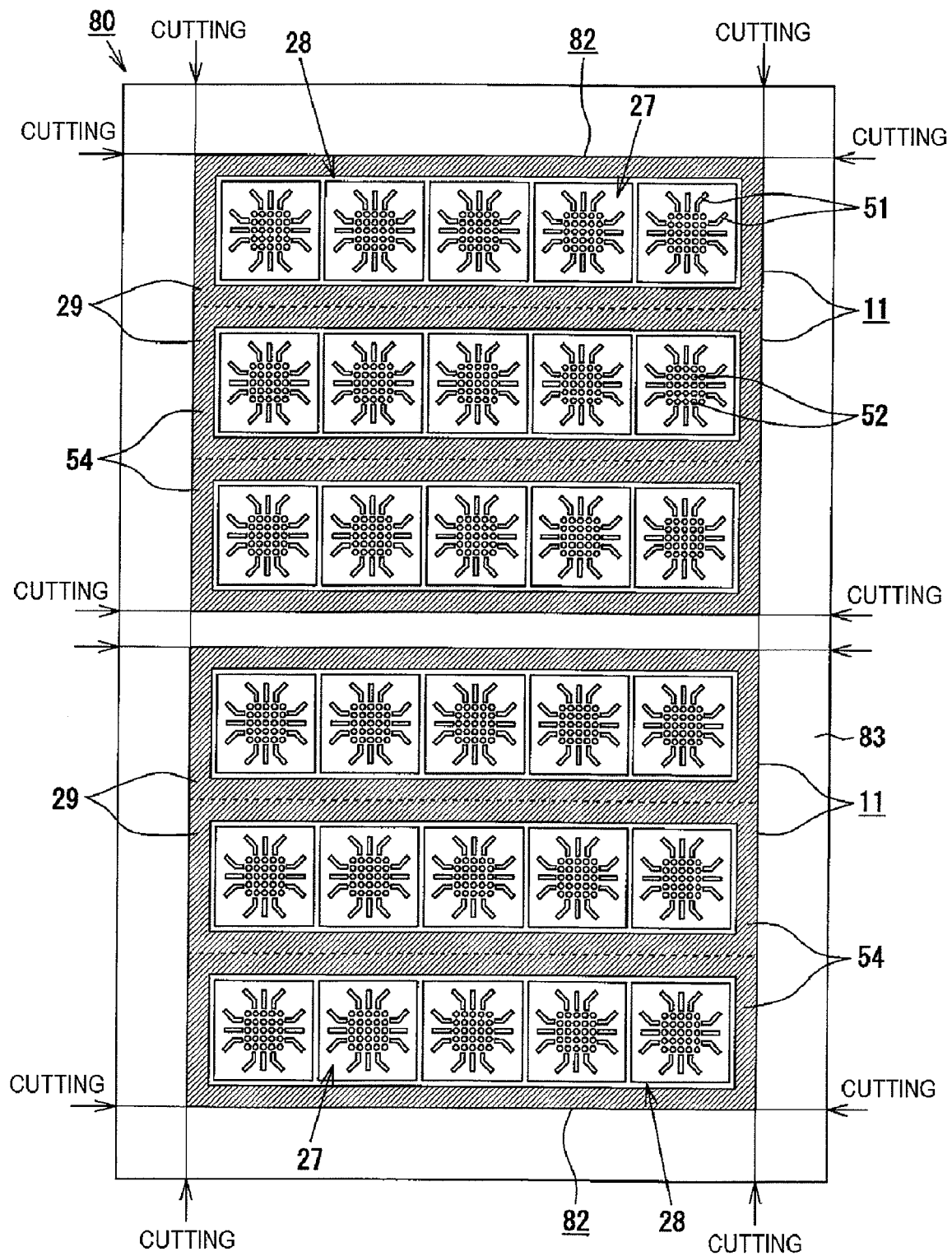
FIG. 10 is a diagram showing a configuration of components at another point in the method for manufacturing the coreless wiring board according to the first exemplary embodiment.

The resin insulating layers 42 to 44 on the second through fourth strata and the conductor layers 51 are also formed on the resin insulating layer 41 in a stacked manner, by means of the same technique as that used for making the resin insulating layer 41 on the first stratum and the conductor layer 51 formed thereon as described above. Photosensitive epoxy resin is applied over the resin insulating layer 44 where the terminal pads 52 are made, and the thus-applied resin is cured, thereby forming the solder resist 128. The solder resist 128 is subjected to exposure and development while a mask is placed, thereby making the openings 129 in the solder resist 128 through patterning. According to the above-described manufacturing processes, a layered product 80 in which the multilayer metal sheet member 72, the resin insulating layers 41 to 44, and the conductor layers 51 are stacked is formed on a support board 70 (see FIGS. 9 and 10). As shown in FIG. 9, a region on the multilayered product 80 situated on the multilayered metal sheet member 72 serves as a stacked wiring region 81 that is to become the intermediate product 11 of the coreless wiring board 101. Further, as shown in FIG. 10, two blocks 82 are arranged on the multilayered product 80 along a major surface thereof, three intermediate products 11 are arranged in each of the blocks 82 along the direction of the major surface, and a periphery of the blocks 82 is surrounded by a peripheral portion 83.

Figure 11:
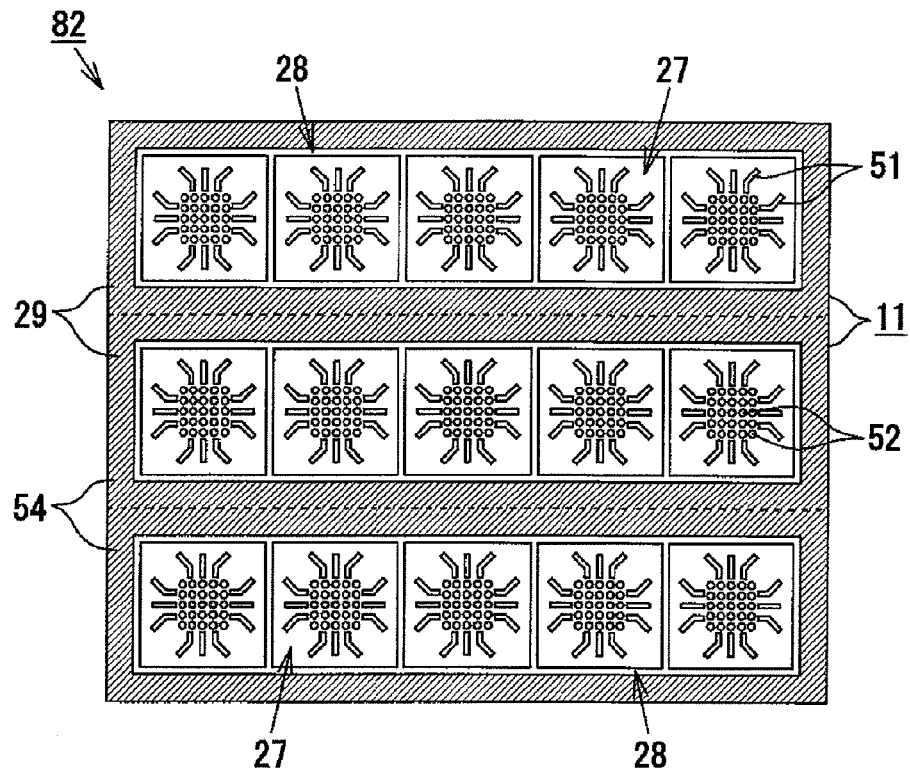
FIG. 11 is a diagram showing a configuration of components at another point in the method for manufacturing the coreless wiring board according to the first exemplary embodiment.

In a subsequent first separation process, the multilayered product 80 is cut by means of a dicing machine (omitted from the drawings), thereby removing the peripheral portion 83 of the respective blocks 82. At this time, as shown in FIG. 10, the base resin insulating layer 71 and the support board 70, which are located below the stacked wiring region 81, are cut along borders between the respective blocks 82 and their peripheral portion 83. Thereby, the blocks 82 are separated from each other, whereby two blocks 82 (see FIG. 11) are obtained.

Figure 12:
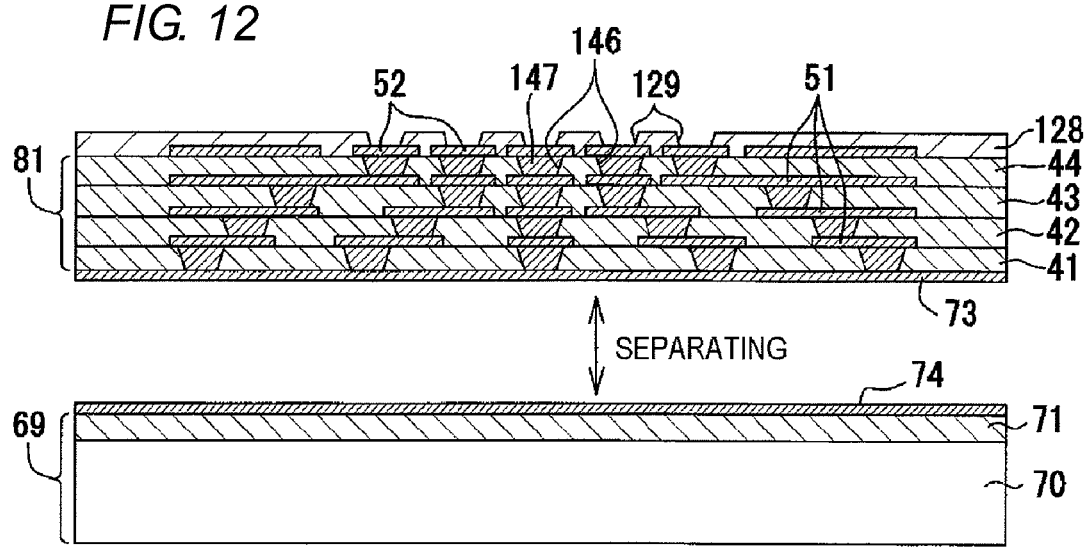
FIG. 12 is a diagram showing a configuration of components at another point in the method for manufacturing the coreless wiring board according to the first exemplary embodiment.
Figure 13:
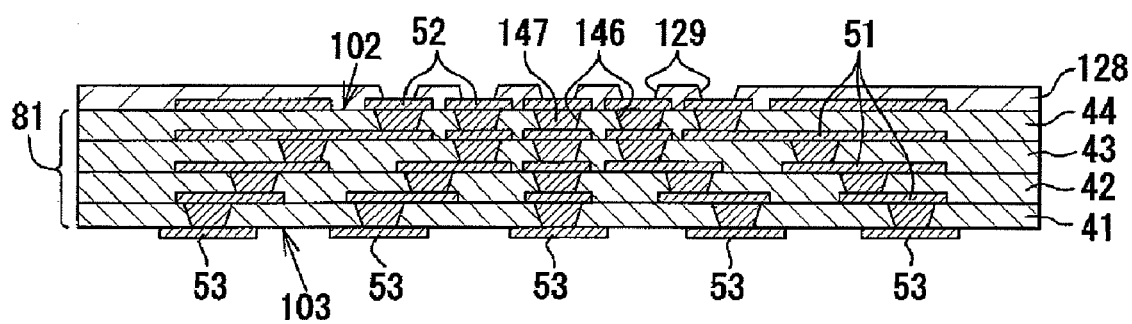
FIG. 13 is a diagram showing a configuration of components at another point in the method for manufacturing the coreless wiring board according to the first exemplary embodiment.
Figure 14:
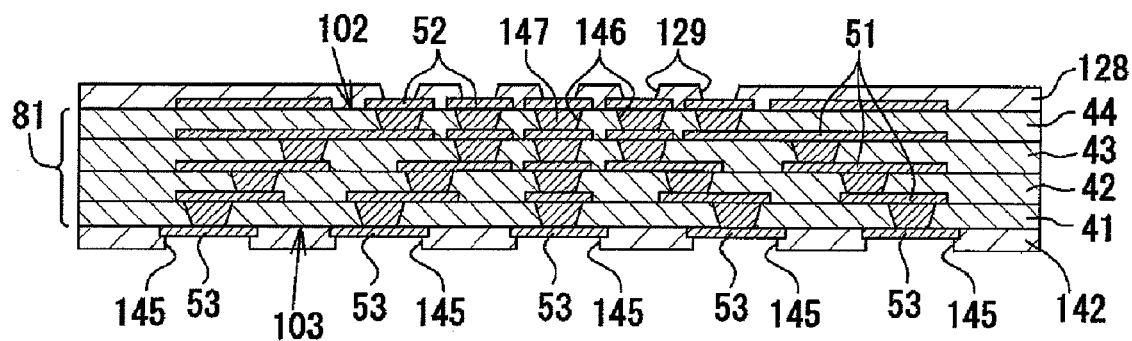
FIG. 14 is a diagram showing a configuration of components at another point in the method for manufacturing the coreless wiring board according to the first exemplary embodiment.

In each of the blocks 82, the base member 69 is removed so as to expose the copper foil 73 (a base member removal process). More specifically, as shown in FIG. 12, the stacked wiring portion 81 is separated from the support board 70 by peeling the two sheets of copper foil 73 and 74 in the stacked metal sheet 72. As shown in FIG. 13, the copper foil 73 on the rear surface 103 (a lower surface) of the stacked wiring region 81 (the resin insulating layer 41) is patterned by etching so as to form the BGA pads 53 within the product portion 27 on the resin insulating layer 41 on the outermost stratum (a first conductor layer formation process). Subsequently, as shown in FIG. 14, a photosensitive epoxy resin is applied over the resin insulating layer 41 in which the BGA pads 53 are formed, and the resin is cured, thereby forming the solder resist 142 covering the rear surface 103 of the stacked wiring portion 81 (a solder resist formation process). Next, the solder resist 142 is subjected to exposure and development while a mask is placed on the solder resist 142, thereby patterning the solder resist 142 to form the openings 145.

Figure 15:
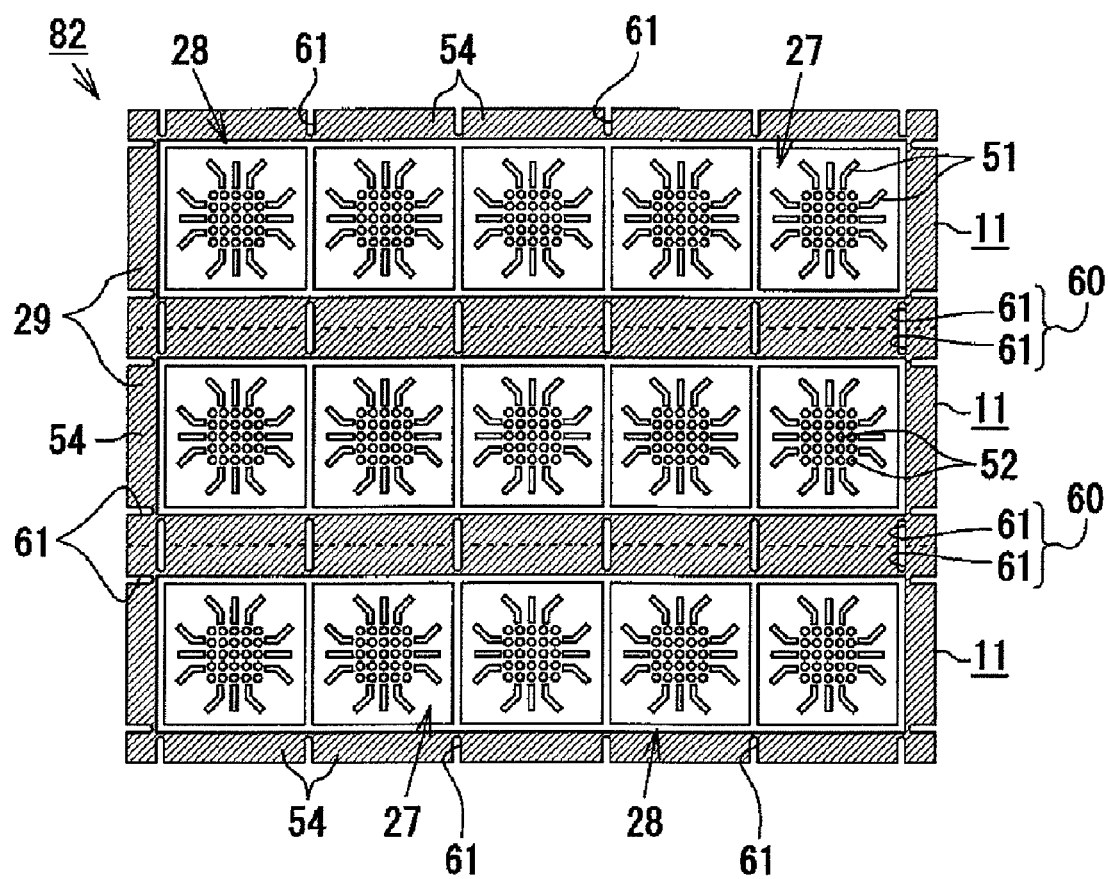
FIG. 15 is a diagram showing a configuration of components at another point in the method for manufacturing the coreless wiring board according to the first exemplary embodiment.

In a subsequent cut formation process, the plurality of slits 61 are formed in the frame portions 29 of each the intermediate products 11 forming the block 82 (see FIG. 15). Specifically, regions in the frame portions 29 where the frame portions 29 of adjacent intermediate products 11 contact each other are machined by a router so as to form elongated holes 60. The elongated holes 60 becomes the slit 61 of a particular intermediate product 11 and a slit 61 of an intermediate product 11 adjoining to the particular intermediate product 11. Further, regions in the frame portions 29 where the frame portions 29 of adjacent intermediate products 11 do not contact each other are machined by the router so as to the slits 61. These slits 61 are formed after the conductor layers 51, the terminal pads 52, the BGA pads 53, and the frame-side conductor layer 54 have been formed (after a first conductor layer formation process).

Next, the solder bumps 130 used for connecting an IC chip are formed on the respective terminal pads 52 formed on the resin insulating layer 44 on the outermost stratum (a solder bump formation process). The cut formation process is performed prior to the solder bump formation process. In this process, solder balls are arranged on the respective terminal pads 52 by use of an unillustrated solder ball mounting machine, and the solder balls are subsequently heated at a given temperature so that solder reflows and the solder bumps 130 are formed on the respective terminal pads 52. Likewise, the solder bumps 155 are formed also on the respective BGA pads 53 formed on the rear surface 103 of the multilayered wiring region 81.

In a subsequent second separation process, the blocks 82 are cut along the border lines between the intermediate products 11 by a dicing machine (not shown). The intermediate products 11 are thereby separated from one another, so that the intermediate product 11 for the coreless wiring boards 101 shown in FIGS. 2 and 3 can be obtained.

In a subsequent IC chip mount process, the IC chip 131 is mounted on each of the IC chip mount regions 133 of the respective product portions 27 (the coreless wiring boards 101) forming each of the intermediate products 11. The surface connection terminals 132 formed on the IC chip 131 are aligned with the respective solder bumps 130 formed on the product portion 27. The solder bumps 130 are heated so as to reflow such that the surface connection terminals 132 and the solder bumps 130 are bonded together. Accordingly, the IC chip 131 is mounted on the product portion 27.

In a subsequent third separation process, the frame portions 29 are cut and removed from the product forming region 28 by a known cutting machine, and the product forming region 28 is cut along the cutting lines 121. The product portions 27 are separated from one other into a plurality of pieces of coreless wiring boards 101 (see FIG. 1).

According to the first exemplary embodiment, the advantages described below can be obtained.

(1) According to the intermediate product 11 of the coreless wiring board 101 of this exemplary embodiment, even when thermal stress caused a difference in a coefficient of thermal expansion between the product forming region 28 and the frame portion 29 is applied to the intermediate product 11 during cooling of the solder bumps 130 for connecting the IC chip 131, the influence of thermal stress is reduced by deformation of the plurality of slits 61. Moreover, the slits 61 are placed at substantially equal intervals in the frame portions 29, which can provide uniform amounts of deformation in the respective slits 61 when thermal stress is applied to the slits 61. Hence, the thermal stress is uniformly lessened. Therefore, occurrence of warpage in the intermediate products 11 can be prevented, so that yields of products (the coreless wiring boards 101) obtained from the intermediate products 11 can be enhanced.

(2) In the first exemplary embodiment, portions of the product forming region 28 are covered with the first conductor layers (the conductor layer 51 and the terminal pads 52), whereas a substantially entire regions of the frame portion 29 is covered with the second conductor layer (frame-side conductor layer 54). Therefore, there exists a great difference between an area ratio of the first conductor layer to the product forming region 28 and an area ratio of the second conductor layer to the frame portion 29. When the IC chip 131 is mounted on the terminal pads 52 and when the solder bumps 130 used for connection are cooled, thermal stress caused by the difference in the area ratios is applied the intermediate product 11. However, in the first exemplary embodiment, the influence of thermal stress caused by the difference in the area ratio can be suppressed by the plurality of slits 61.

The first exemplary embodiment may be modified as described below.

Figure 16:
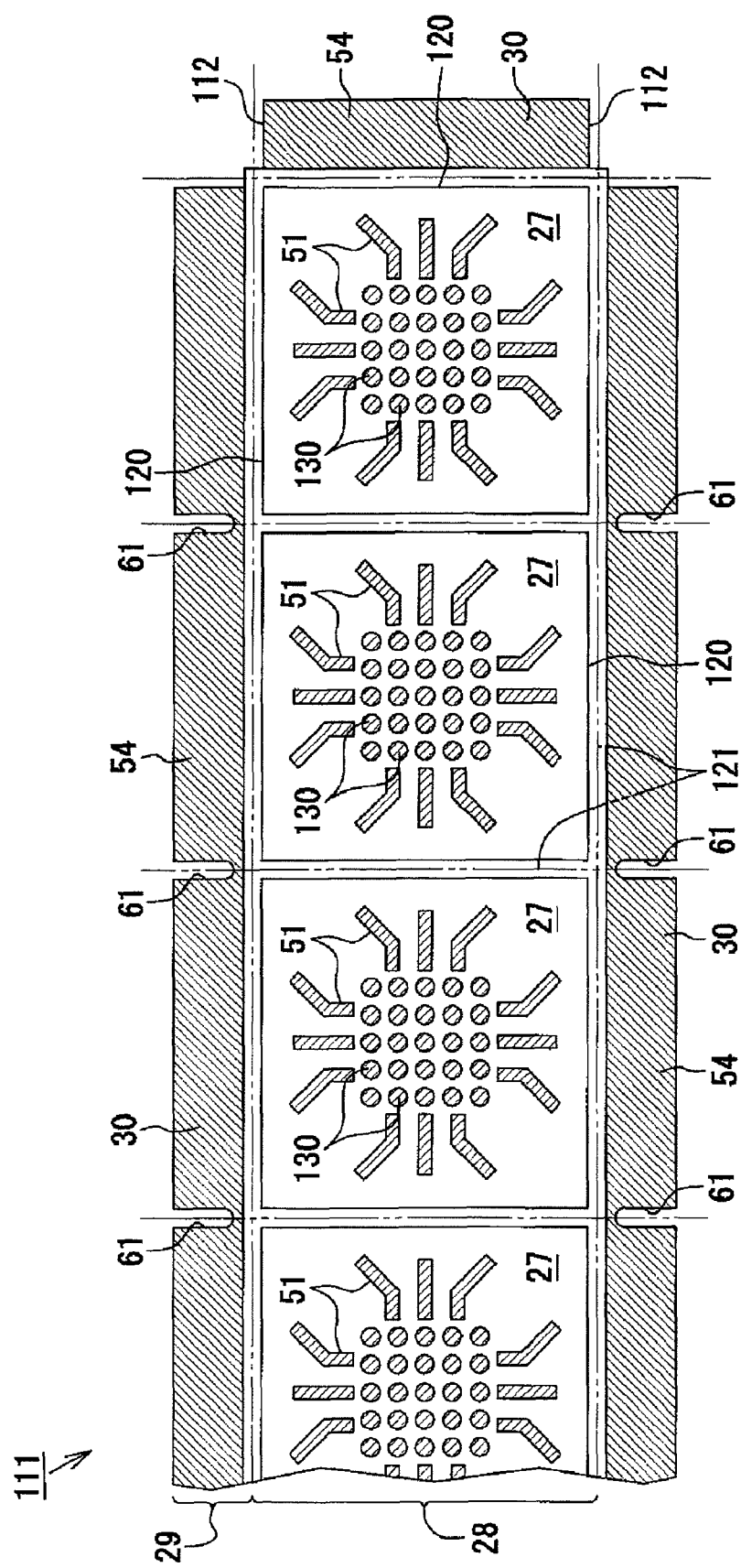
FIG. 16 is a schematic plan view showing an intermediate product of a coreless wiring board a modification of the first exemplary embodiment.

In the intermediate product 11 of the coreless wiring board 101 of the first exemplary embodiment, each of the plurality of cuts is formed of a slit 61. However, the intermediate product may include cuts, some of which have a shape differing from the slit 61. FIG. 16 shows an intermediate product 111 according to one modification of the first exemplary embodiment. In the intermediate product 111, cuts located in the edge potions 30 are formed the slits 61 as in the first exemplary embodiment. On the other hand, cuts located at the corner portions 31 are formed of cuts 112 which are formed by removing the respective corner portions 31. In other words, the cuts 112 are defined by respective removed corner portions 31. The cuts 112 formed at the respective corner portions 31 can be formed larger than the cuts (slits 61) located at the edge portions 30. Hence, the influence of thermal stress applied to the intermediate product 111 can be reduced more reliably. As a result, occurrence of warpage in the intermediate product 111 can be prevented more reliably, so that product yields are enhanced further.

The slits 61 of the first exemplary embodiment are arranged in the frame portions 29 along the extensions of the cutting lines 121 set along the contour lines 120 of the product portions 27. However, the slits 61 may also be arranged at positions slightly deviated from the extensions of the cutting lines 121 in the direction of the major surface of the intermediate product 11.

The cut formation process of the first exemplary embodiment is performed between the first conductor layer formation process and the solder bump formation process. However, the cut formation process may be performed between the solder bump formation process and the second separation process or between the second separation process and the IC chip mount process.

Second Exemplary Embodiment

A second exemplary embodiment of the invention will be described with reference to drawings. In the second exemplary embodiment, non-formation regions are formed on an intermediate product, instead of the cut portions 61 of the first exemplary embodiment. Similar or identical elements and operations in connection with the first exemplary embodiment are denoted by identical reference symbols, and the description thereof is omitted in this exemplary embodiment.

Figure 17:
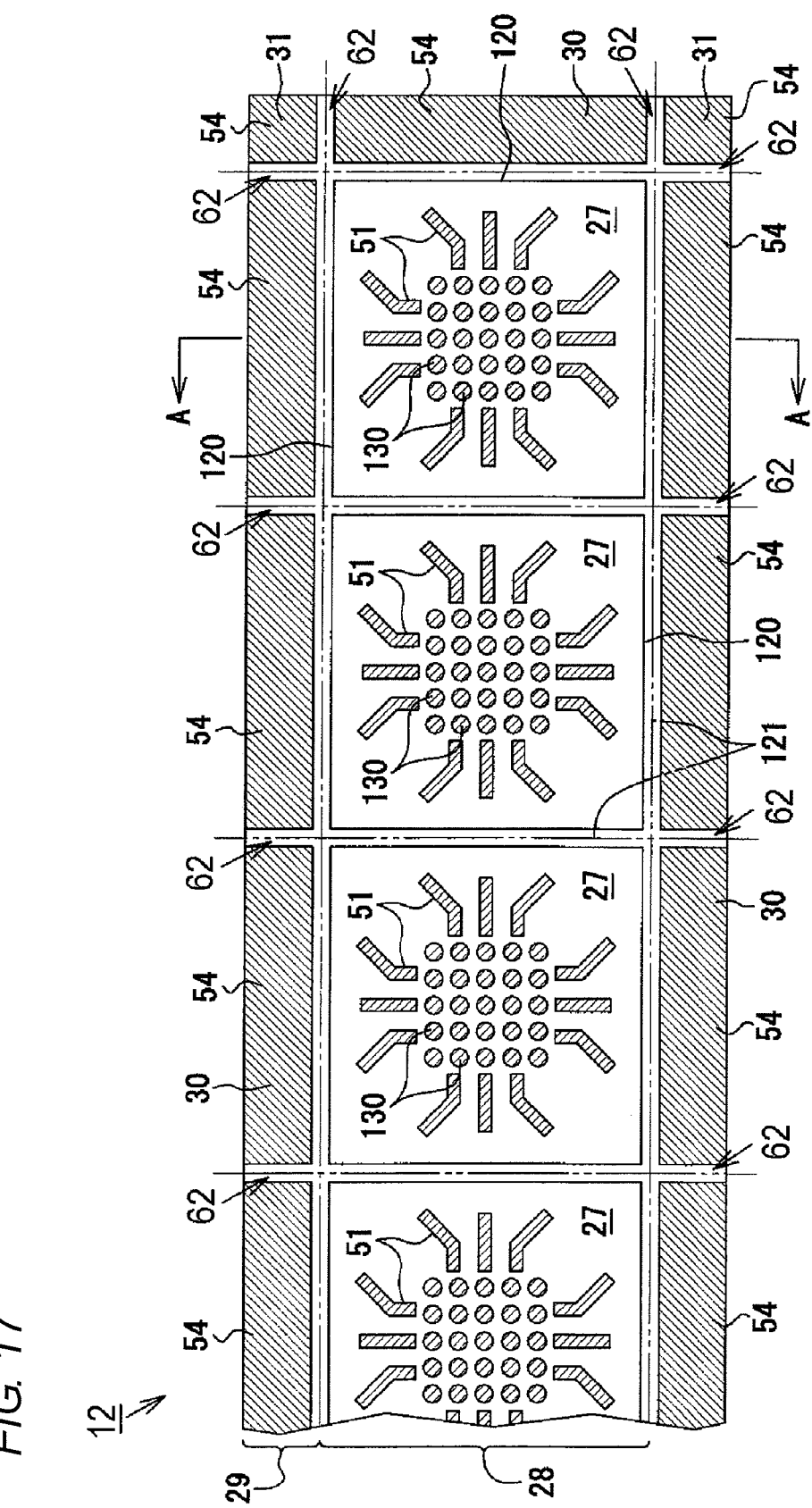
FIG. 17 is a schematic plan view showing an intermediate product of the coreless wiring board according to a second exemplary embodiment.

FIG. 17 is a schematic plan view showing an intermediate product 12 of a coreless wiring board according to the second exemplary embodiment. Since a cross-sectional view of the coreless wiring board of this exemplary embodiment is the same as that shown in FIG. 1, and a cross-sectional view of the intermediate product 12 cut along A-A line of FIG. 17 is the same as that shown in FIG. 3, related description thereto is omitted.

As shown in FIG. 17, a plurality of non-formation regions 62 are arranged on each of the resin insulating layers 41 to 44 within the frame portion 29. In the non-formation region 62, the frame-side conductor layer 54 is not formed. The non-formation regions 62 have a slit shape, which are arranged at substantially uniform intervals in each of the edge portions 30 and which are arranged along (or arranged on) extensions of the respective cutting lines 121. A part of the non-formation regions 62 is arranged along boundaries between the edge portions 30 and the corner portions 31. Since the respective non-formation regions 62 are opened in inner and outer edges of the frame portion 29, the length of each of the non-formation regions 62 is set equal to the width of the frame-side conductor layer 54 (a distance from the inner edge of the frame-side conductor layer 54 to the outer edge thereof). Specifically, the frame-side conductor layer 54 is divided by the respective non-formation regions 62. Further, the width of the non-formation region 62 is set equal to an interval between the contour lines 120 of adjacent product areas 27 or an interval between the contour line 120 of the product portion 27 and the inner edge of the frame-side conductor layer 54.

The non-formation regions 62 are arranged on each of the resin insulating layers 41 to 44 in the frame portions 29, such that a first area ratio of the first conductor layer (the conductor layers 51 or the terminal pads 52) to the product forming region 28 becomes, at each layer, equal to an area ratio of the second conductor layer (frame-side conductor layer 54) to the frame portion 29. More specifically, on the surface of the resin insulating layer 41 on the first stratum, both the first area ratio of the conductor layer 51 to the product forming region 28 and the second area ratio of the frame-side conductor layer 54 to the frame portion 29 are set to 67%. On the surface of the resin insulating layer 42 on the second stratum, both the first area ratio of the conductor layer 51 to the product forming region 28 and the second area ratio of the frame-side conductor layer 54 to the frame portion 29 are set to 86%. On the surface of the resin insulating layer 43 on the third stratum, both the first area ratio of the conductor layer 51 to the product forming region 28 and the second area ratio of the frame-side conductor layer 54 to the frame portion 29 are set to 64%. On the surface of the resin insulating layer 44 on the fourth stratum, both the first area ratio of the conductor layer 51 and the terminal pads 52 to the product forming region 28 and the second area ratio of the frame-side conductor layer 54 occupying the frame portion 29 are set to 78%.

Figure 8:
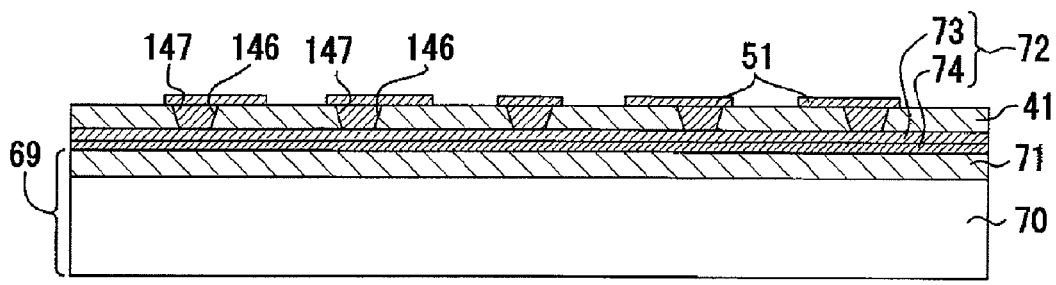
FIG. 8 is a diagram showing a configuration of components at another point in the method for manufacturing the coreless wiring board according to the first exemplary embodiment.

Next, a method for manufacturing the coreless wiring board according to the second exemplary embodiment is described. At first, the preparation process is performed as shown in FIGS. 4 and 5. Next, the stacking process is performed as shown in FIG. 6, and then the via holes 146 are formed as shown in FIG. 7. Thereafter, the via conductors 147 and the conductor layers 51 are formed as shown in FIG. 8.

In the second exemplary embodiment, in a same process for patterning the conductor layer 51, the frame-side conductor layer 54 is patterned on the resin insulating layer 41 in the frame portions 29 of the intermediate products 12, and also the plurality of non-formation regions 62 in which the frame-side conductor layer 54 is not present are formed in the frame portions 29.

Figure 18:
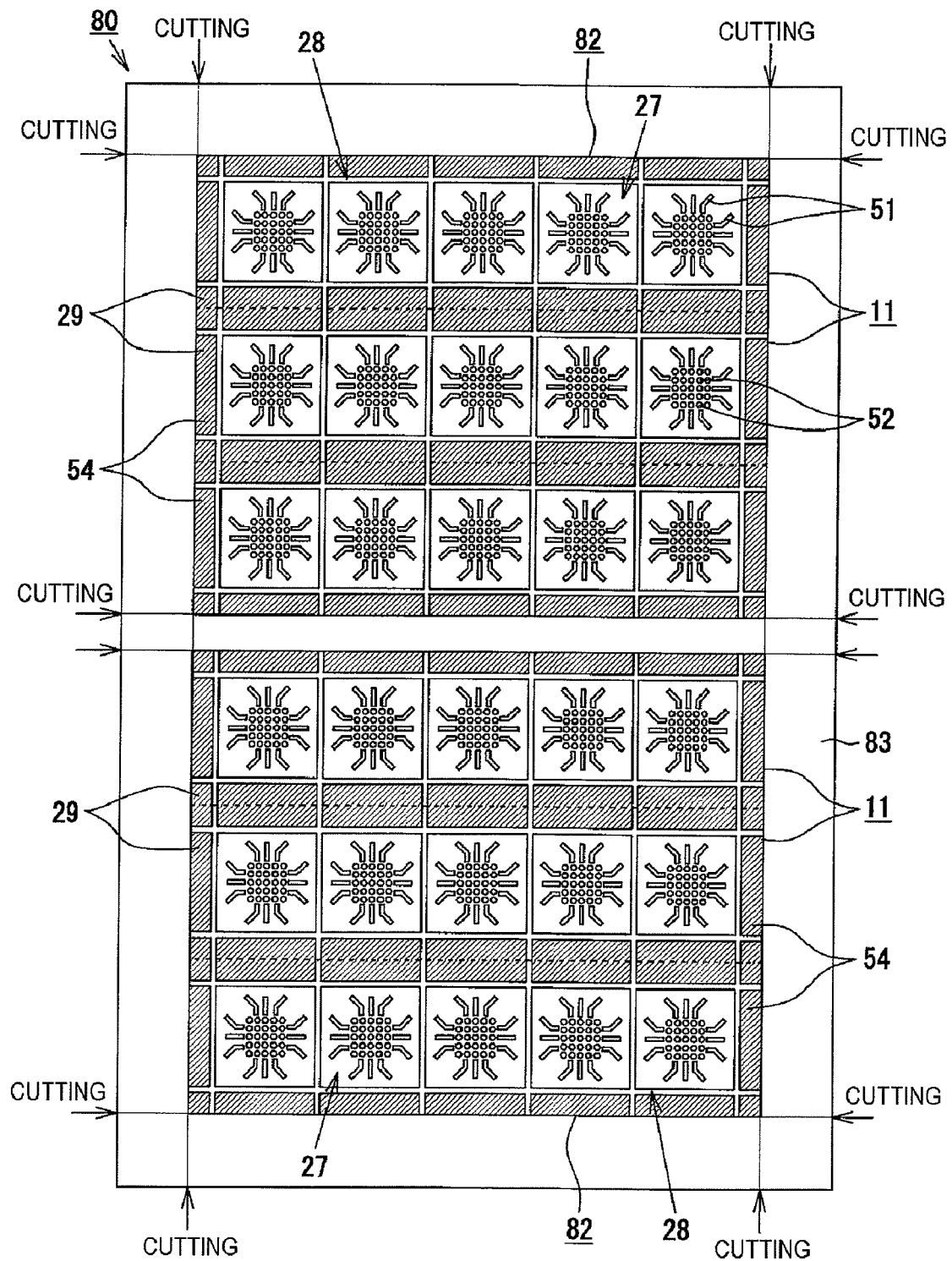
FIG. 18 is a diagram showing a configuration of components at a point in the method for manufacturing the coreless wiring board according to the second exemplary embodiment.
Figure 19:
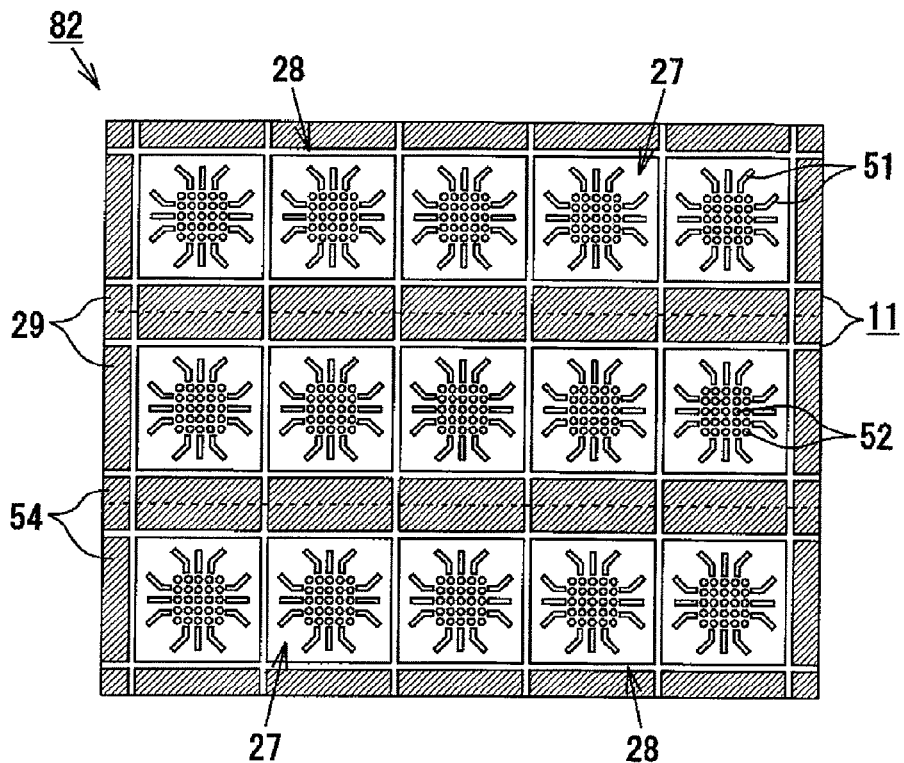
FIG. 19 is a diagram showing a configuration of components at another point in the method for manufacturing the coreless wiring board according to the second exemplary embodiment.

Next, the layered product 80 is formed on the support board 70 as shown in FIG. 9. FIG. 18 is a plan view showing the layered product 80 of the second exemplary embodiment. Next, the first separation process is performed as in the first exemplary embodiment. FIG. 19 is a plan view showing the block 82 of the second exemplary embodiment which is separated by the first separation process. Thereafter, the base member removal process shown in FIG. 12, the first conductor layer formation process shown in FIG. 13, and the solder resist formation process shown in FIG. 14 are performed. Further, the solder bump formation process and the second separation process are performed as in the first exemplary embodiment, whereby the intermediate product 12 shown in FIG. 17 (and FIG. 3) is obtained. Thereafter, the first separation process is performed as in the first exemplary embodiment, whereby the plurality pieces of the coreless wiring board 101 (FIG. 1) is obtained.

A method for evaluating warpage in intermediate products of coreless wiring boards and results of evaluation are now described.

Figure 20:
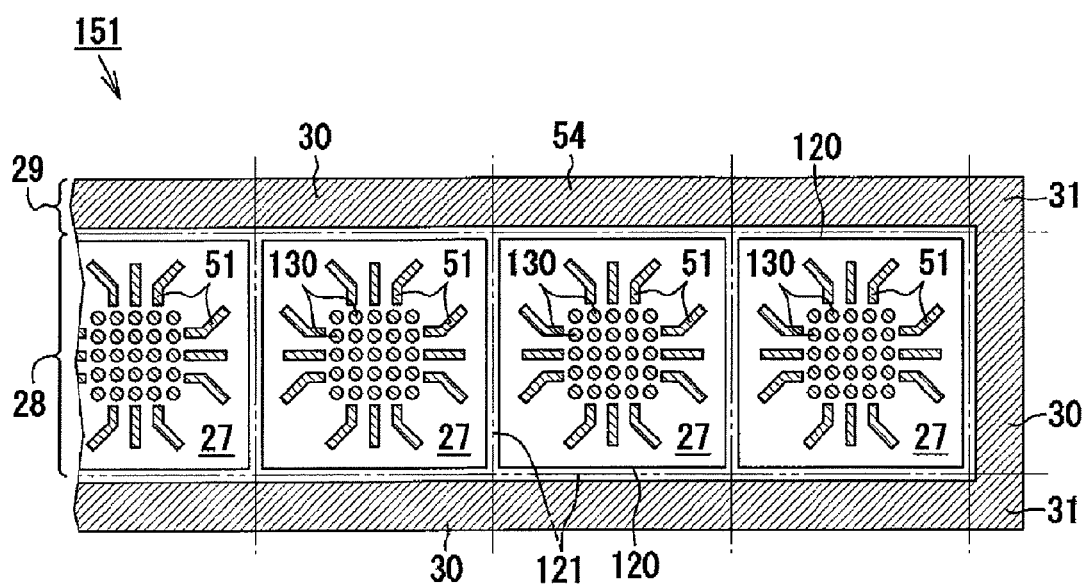
FIG. 20 is a schematic plan view showing an intermediate product of a coreless wiring board of a comparative example.

First, samples for measurement purpose (measurement samples) are prepared as follows: an intermediate product 12 identical with that of the second exemplary embodiment is prepared as a sample of an example; and an intermediate product 151 (see FIG. 20), in which the non-formation region 62 is not formed in the frame portion 29 and the frame-side conductor layer 54 covers substantially entire region of the frame portion 29, is prepared as a sample of a comparative example.

Next, the measurement samples (of the example and the comparative example) are heated, thereby causing the respective solder bumps 130 formed on the terminal pads 52 to reflow. An amount of warpage occurred in each of the measurement samples is measured. Specifically, each of the measurement samples is placed on a support bed (not shown), and the height from the surface of the support bed to a point in the measurement sample where there is the largest lift is measured as the amount of warpage.

As a results of measurement of warpage, the amount of warpage in the intermediate product 151 of the comparative example is 2.458 mm, whereas the amount of warpage in the intermediate product 12 of the example (i.e., according to the second exemplary embodiment) is 0.464 mm. Thus, the amount of warpage in the intermediate product 12 of the embodiment is ascertained to be smaller than the amount of warpage in the intermediate product 151 of the comparative example. Accordingly, it is shown that arranging the plurality of non-formation regions 62 in the frame portion 29 makes it difficult to cause warpage in an intermediate product.

According to the second exemplary embodiment, the advantages described below can be obtained.

(1) In the intermediate product 12 of the coreless wiring board 101 of the second exemplary embodiment, the first area ratio of the first conductor layer to the product forming region 28 and the second area ratio of the second conductor layer (the frame-side conductor layer 54) to the frame portion 29 are made equal to each other by arranging the plurality of non-formation regions 62. Accordingly, a difference in a coefficient of thermal expansion between the product forming region 28 and the frame portion 29 is reduced. As a consequence, if thermal stress caused by the difference in coefficient of thermal expansion is applied to the intermediate product 12 during cooling of the solder bumps 130 used for connecting the IC chip 131, warpage hardly occurs in the intermediate product 12. Therefore, yields of products (the coreless wiring board 101) produced from the intermediate products 12 can be enhanced.

(2) In the second exemplary embodiment, the first conductor layers (the conductor layer 51 and the terminal pads 52) are patterned on each of the resin insulating layers 41 to 44, and the frame-side conductor layers 54 (and the non-formation regions 62) are simultaneously patterned, and hence processes for manufacturing the coreless wiring board 101 can be shortened. Further, the non-formation regions 62 have a comparatively simple shape such as a slit shape. Therefore, the burden of pattern design can be alleviated, which makes it easy to prevent an increase in the cost of the coreless wiring board 101.

The second exemplary embodiment may also be changed as follows.

Figure 21:
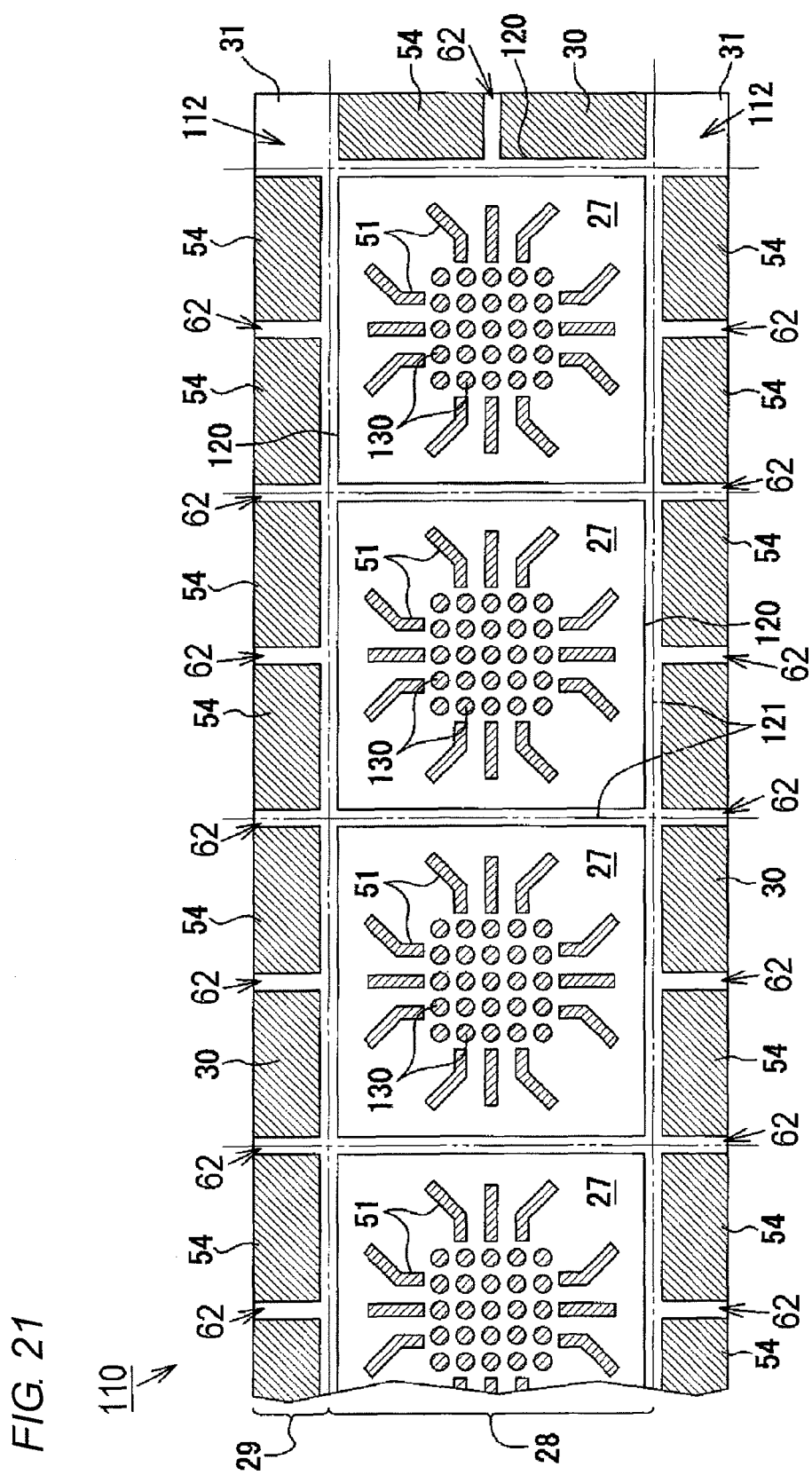
FIG. 21 is a schematic plan view showing an intermediate product of a coreless wiring board according to a modification of the second exemplary embodiment.
Figure 23:
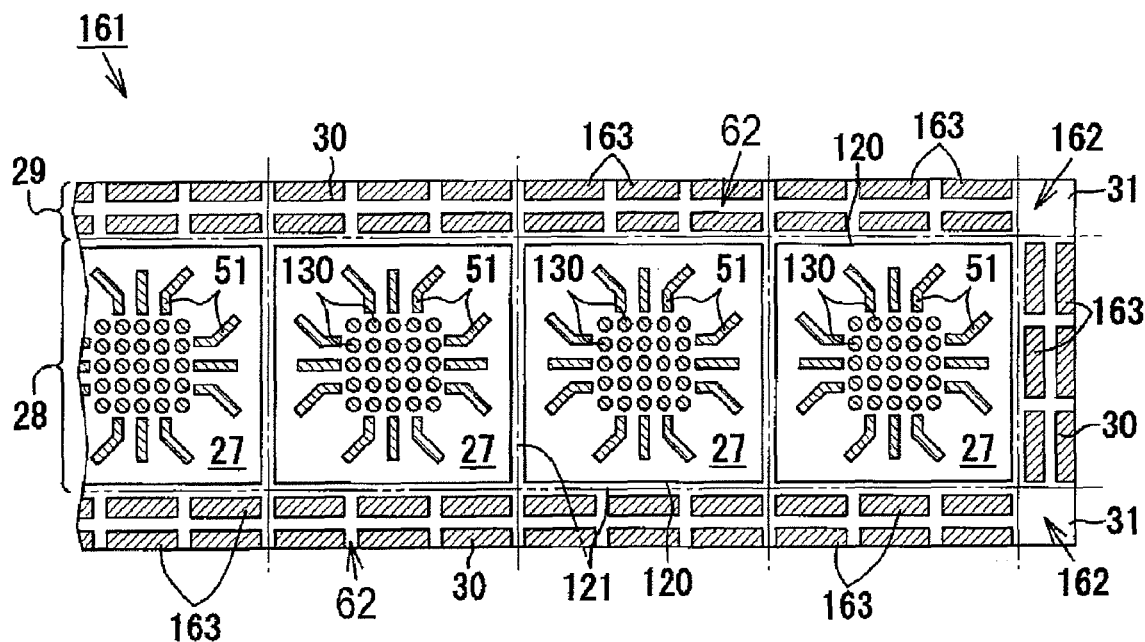
FIG. 23 is a schematic plan view showing an intermediate product of a coreless wiring board according to yet another modification of the second exemplary embodiment.

In the intermediate product 12 of the coreless wiring board 101 of the second exemplary embodiment, all of the plurality of non-formation regions 62 are formed as slit-shaped regions each of which extends on the extensions of the respective cutting lines 121. However, the non-formation regions located at the corner portions 31 may have a shape different from the slit-shaped non-formation regions 62. FIGS. 21 and 23 show intermediate products 110 and 161 according to modifications of the second exemplary embodiment. In the intermediate product 110 shown in FIG. 21, non-formation regions 112 located at the corner portions 31 extends in an entire region of the respective corner portions 31. Further, in the intermediate product 161 shown in FIG. 23, non-formation regions 162 located at the corner portions 31 extend into the entire region of the corner portions 31.

Although the non-formation regions 62 of the second exemplary embodiment are arranged on the extensions of the cutting lines 121 set along the contour lines 120 of the product portions 27 in the frame portion 29, some of the non-formation regions 62 may also be arranged at positions displaced from the extensions of the cutting lines 121 in the direction of a major surface of the intermediate product 110, 161 as shown in FIGS. 21 and 23.

Figure 22:
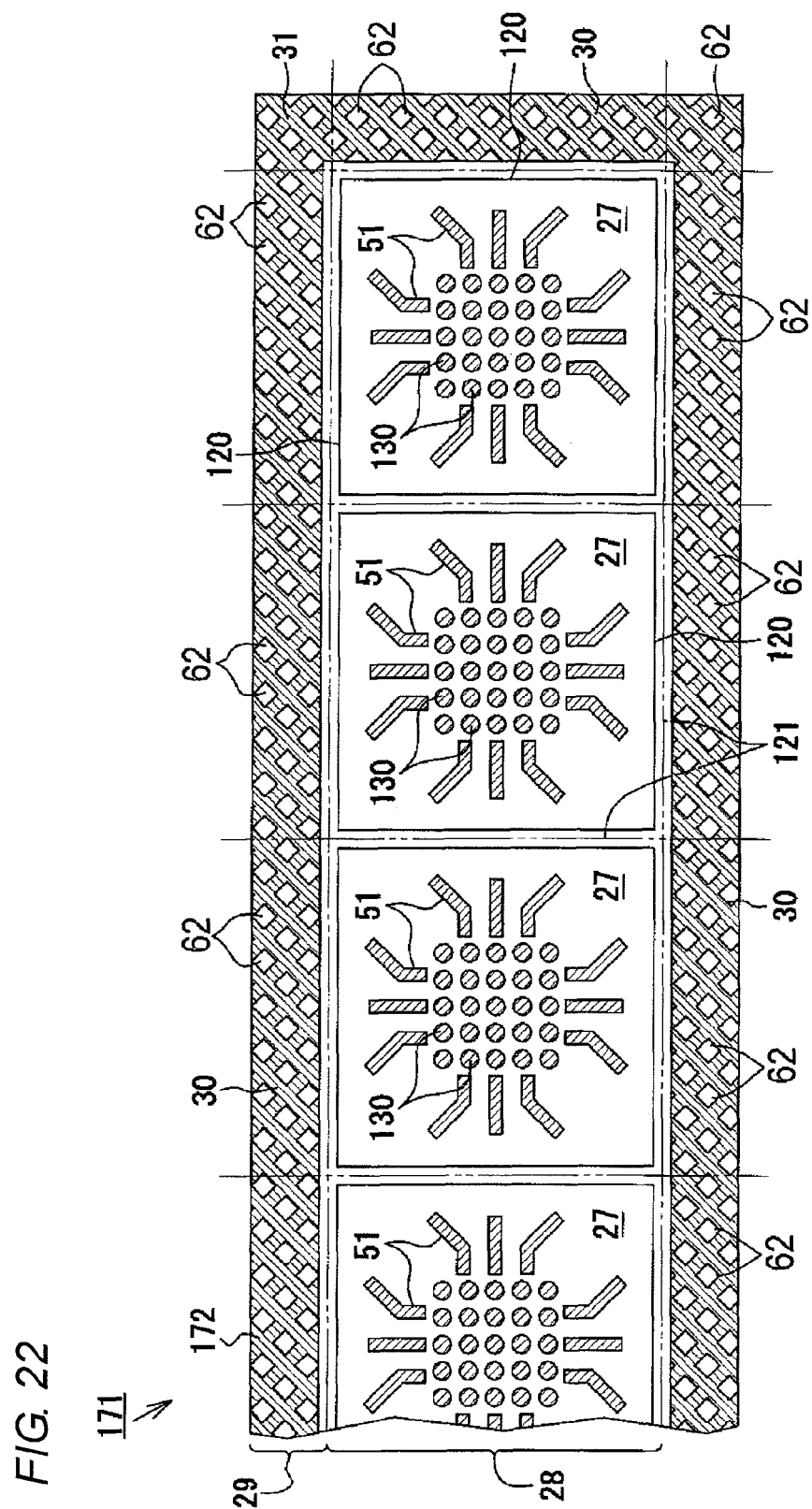
FIG. 22 is a schematic plan view showing an intermediate product of a coreless wiring board according to another modification of the second exemplary embodiment.
Figure 24:
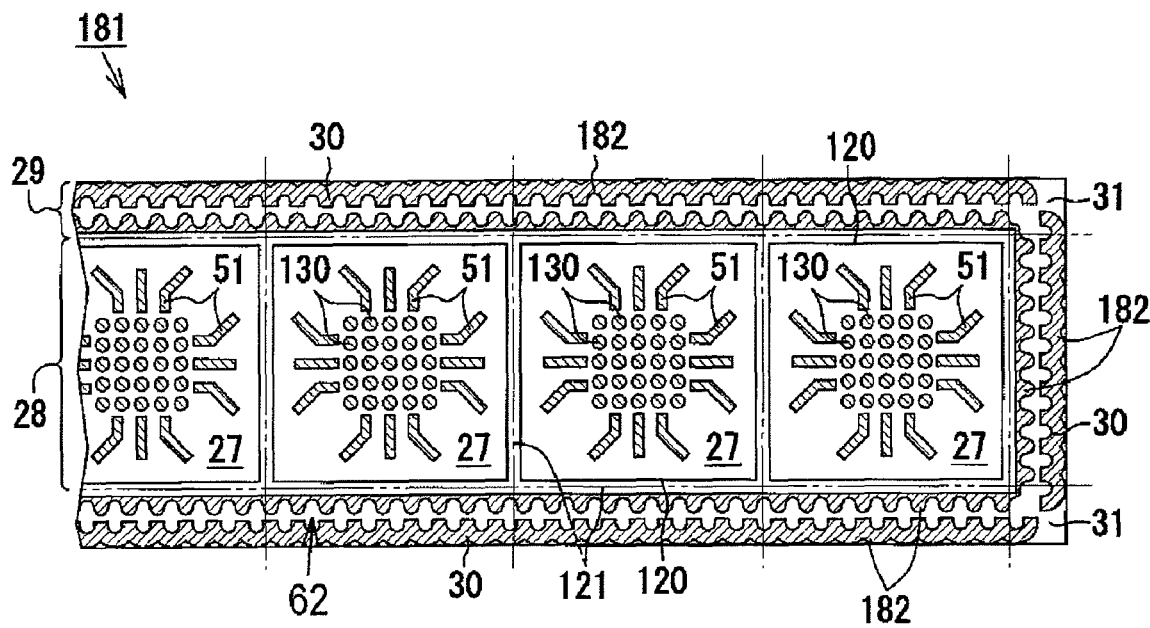
FIG. 24 is a schematic plan view showing an intermediate product of a coreless wiring board according to still another modification of the second exemplary embodiment.

In the intermediate product 12 of the coreless wiring board 101 of the second exemplary embodiment, the frame-side conductor layer 54 is formed within the frame portion 29 in the form of a plane. However, the frame-side conductor layer may have shape different from the frame-side conductor layer 54. FIGS. 22 through 24 show intermediate products 161, 171, and 181. In the intermediate product 171 shown in FIG. 22 a frame-side conductor layer 172 having a meshed pattern is formed within the frame portion 29. In the intermediate product 161 shown in FIG. 23, a frame-side conductor layer 163 in the form of a tile is formed within the frame portion 29. In the intermediate product 181 shown in FIG. 24, a frame-side conductor layer 182 having a wavy pattern is formed within the frame portion 29.

Further, the first and second exemplary embodiments may be modified as follows.

In the method for manufacturing the coreless wiring board 101 of the first and second exemplary embodiments, the solder bumps 130 used for connecting an IC chip are formed respectively on the plurality of terminal pads 52 formed on the resin insulating layer 44 on the uppermost stratum. However, the terminal pads 52 may be BGA pads to be mounted on another connection component, such as a mother board, and solder bumps may be formed on the respective BGA pads. In this case, terminal pads used for connecting an IC chip are made on the rear surface 103 of the integrated wiring region 81.

In the first conductor layer formation process of the first and second exemplary embodiments, the copper foil 73 is patterned by etching to form the BGA pads 53. However, the BGA pads 53 may be separately formed after complete removal of the copper foil 73 through etching.

In the stacking process of the first and second exemplary embodiment, the resin insulating layer 41 may be formed after a metal layer to be the BGA pads 53 has been formed on the copper foil 73. In this case, the via conductors 147 are formed in the respective via holes 146 after the via holes 146 for exposing the metal layer formed in the resin insulating layer 41. By forming the via conductors as described above, the copper foil 73 is completely removed by etching so as to expose the metal layer, and the metal layer can be formed into the BGA pads 53.

One of ordinary skill in the art will recognize that additional steps and configurations are possible without departing from the teachings of the invention. This detailed description, and particularly the specific details of the exemplary embodiment disclosed, is given primarily for clearness of understanding and no unnecessary limitations are to be understood therefrom, for modifications will become evident to those skilled in the art upon reading this disclosure and may be made without departing from the spirit or scope of the claimed invention.

Thus, the scope of the invention should be determined by the appended claims and their legal equivalents, and not by examples given.

What is claimed is:

1. An intermediate multilayer wiring board product comprising:

a stack of a plurality of resin insulating layers, the stack comprising:

a product forming region comprising a plurality of product portions arranged along a major surface of the stack, each of the plurality of product portions to become a product of the multilayer wiring board; and a frame portion surrounding the product forming region;

a first conductor layer formed on at least one of the plurality of resin insulating layers within each of the plurality of product portions; and a second conductor layer formed on at least one of the plurality of resin insulating layers within the frame portion;

wherein the frame portion has a plurality of cuts completely penetrating the frame portion in a thickness direction thereof, the plurality of cuts being arranged at substantially equal intervals; wherein at least one of the plurality of cuts is a slit extending along an extension of a cutting line set along a contour line of a respective one of the plurality of product portions and having a width substantially equal to an interval between contour lines of adjacent product portions.

2. The intermediate product according to claim 1, wherein the frame portion has a plurality of edge portions surrounding the product forming region and a plurality of corner portions, each connecting adjacent edge portions, and wherein at least one of the plurality of cuts is located in at least one of the plurality of corner portions which is formed by removing a corresponding corner portion.

3. The intermediate product according to claim 1, wherein the plurality of cuts are formed after the first conductor layer and the second conductor layer are formed.

4. The intermediate product according to claim 1, further comprising a solder bump for connecting a component provided on the first conductor layer formed on an outermost resin insulating layer of the stack.

5. The intermediate product according to claim 1, wherein the multilayer wiring board comprises the plurality of resin insulating layers and a plurality of the first conductor layers which are alternately stacked, wherein each of the plurality of resin insulating layers is made of a same type of resin insulating layer, and wherein the plurality of the first conductor layers are connected through via holes diametrically enlarged in one direction.

6. An intermediate multilayer wiring board product comprising:

a stack of a plurality of resin insulating layers, the stack comprising:

a product forming region comprising a plurality of product portions arranged along a major surface of the stack, each of the plurality of product portions to become a product of the multilayer wiring board; and a frame portion surrounding the product forming region;

a first conductor layer formed on at least one of the plurality of resin insulating layers within each of the plurality of product portions; and a second conductor layer formed on at least one of the plurality of resin insulating layers within the frame portion, except for a plurality of non-formation regions arranged in the frame portion such that a first area ratio of the first conductor layer to the product forming region is substantially equal to a second area ratio of the second conductor layer to the frame portion, wherein at least one of the plurality of non-formation regions has a slit-shape extending along an extension of a cutting line set along a contour line of a respective one of the plurality of product portions, and wherein the at least one of the plurality of non-formation regions having a slit-shape extends up to an outer edge of the frame portion.

7. The intermediate product according to claim 6, wherein each of a plurality of the second conductor layers is formed on each of the plurality of resin insulating layers, except for the plurality of non-formation regions, such that the first area ratio and the second area ratio are equal to each other in each of the plurality of resin insulating layers.

8. The intermediate product according to claim 6, wherein the frame portion has a plurality of edge portions surrounding the product forming region and a plurality of corner portions, each connecting adjacent edge portions, and wherein at least one of the plurality of non-formation regions is located in at least one of the plurality of corner portions so as to occupy an entire area of a corresponding corner portion.

9. The intermediate product according to claim 6, wherein the second conductor layer has a meshed pattern to have the second area ratio equal to the first area ratio.

10. The intermediate product according to claim 6, wherein the multilayer wiring board comprises the plurality of resin insulating layers and a plurality of the first conductor layers which are alternately stacked, wherein each of the plurality of resin insulating layers is made of a same type of resin insulating layer, and wherein the plurality of the first conductor layers are connected through via holes diametrically enlarged in one direction.

* * * * *